(12) United States Patent
Fang

(10) Patent No.: US 11,538,778 B2
(45) Date of Patent: Dec. 27, 2022

(54) SEMICONDUCTOR PACKAGE INCLUDING ALIGNMENT MATERIAL AND METHOD FOR MANUFACTURING SEMICONDUCTOR PACKAGE

(71) Applicant: Advanced Semiconductor Engineering, Inc., Kaohsiung (TW)

(72) Inventor: Hsu-Nan Fang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 47 days.

(21) Appl. No.: 17/127,671

(22) Filed: Dec. 18, 2020

(65) Prior Publication Data

US 2022/0199559 A1    Jun. 23, 2022

(51) Int. Cl.
*H01L 23/00* (2006.01)
*H01L 21/68* (2006.01)
*H01L 21/60* (2006.01)

(52) U.S. Cl.
CPC .............. *H01L 24/05* (2013.01); *H01L 21/68* (2013.01); *H01L 24/28* (2013.01); *H01L 24/81* (2013.01); *H01L 2021/60075* (2013.01)

(58) Field of Classification Search
CPC ......... H01L 24/05; H01L 21/68; H01L 24/28; H01L 24/81; H01L 2021/60075
See application file for complete search history.

(56) References Cited

U.S. PATENT DOCUMENTS

| | | | | |
|---|---|---|---|---|
| 4,000,842 A | * | 1/1977 | Burns | H01L 24/13 257/781 |
| 11,049,791 B1 | * | 6/2021 | Liff | H01L 21/76801 |
| 11,289,422 B2 | * | 3/2022 | Yan | H01L 25/0657 |
| 2014/0138520 A1 | * | 5/2014 | Liu | H01L 31/18 257/432 |
| 2014/0138521 A1 | * | 5/2014 | Liu | H04N 5/378 257/432 |
| 2014/0252657 A1 | * | 9/2014 | Liu | H01L 23/544 257/782 |
| 2015/0050028 A1 | * | 2/2015 | Budd | G02B 6/4238 29/846 |
| 2017/0023214 A1 | * | 1/2017 | Cheng | H05K 3/4688 |
| 2020/0159133 A1 | * | 5/2020 | Yan | G03F 9/7088 |
| 2020/0243455 A1 | * | 7/2020 | Wang | H01L 24/19 |
| 2020/0243473 A1 | * | 7/2020 | Wang | H01L 27/11568 |
| 2021/0366852 A1 | * | 11/2021 | Kang | H01L 24/03 |
| 2022/0052010 A1 | * | 2/2022 | Goda | H01L 24/05 |

OTHER PUBLICATIONS

Lu, Jian-Qiang et al., "Hybrid Metal/Polymer Wafer Bonding Platform" Chapter 11, Handbook of Wafer Bonding, Wiley-VCH Verlag GmbH & Co. KGaA, Feb. 8, 2012, pp. 215-236.

* cited by examiner

*Primary Examiner* — Mamadou L Diallo
(74) *Attorney, Agent, or Firm* — Foley & Lardner LLP

(57) ABSTRACT

A semiconductor package and a method for manufacturing a semiconductor package are provided. The semiconductor package includes a first semiconductor device, a second semiconductor device, and an alignment material. The first semiconductor device has a first bonding layer, and the first bonding layer includes a first bond pad contacting an organic dielectric material. The second semiconductor device has a second bonding layer, and the second bonding layer includes a second bond pad contacting the organic dielectric material. The alignment material is between the first bonding layer and the second bonding layer.

16 Claims, 25 Drawing Sheets

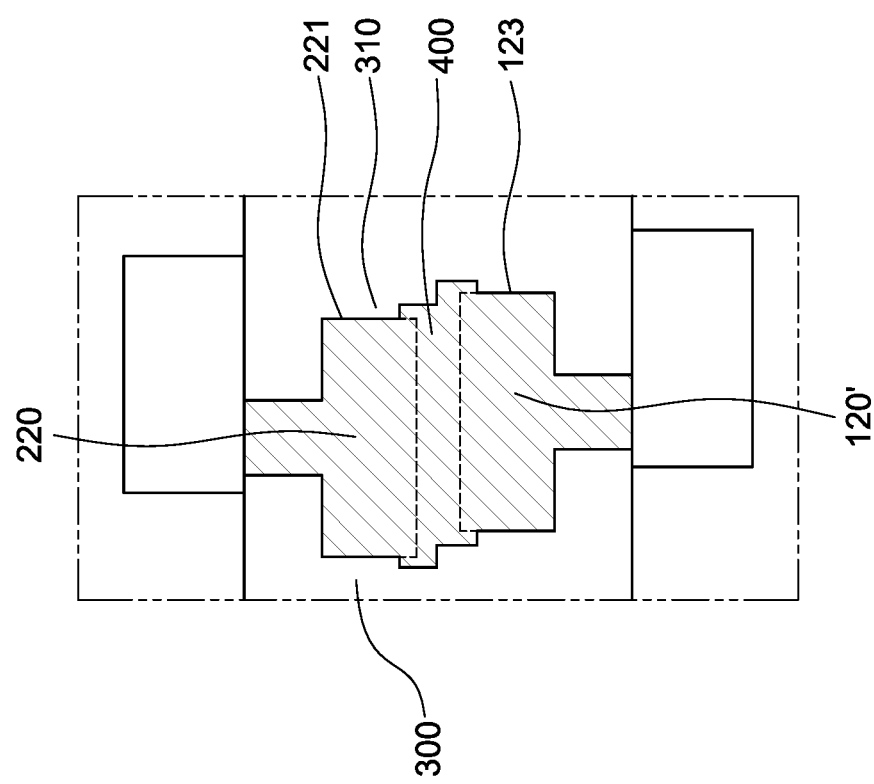

FIG. 8E1

SEMICONDUCTOR PACKAGE INCLUDING ALIGNMENT MATERIAL AND METHOD FOR MANUFACTURING SEMICONDUCTOR PACKAGE

BACKGROUND

1. Technical Field

The present disclosure relates generally to a semiconductor package and a method for manufacturing a semiconductor package.

2. Description of the Related Art

Dies may be bonded to a semiconductor wafer through various hybrid bonding techniques. Currently, the dies and the semiconductor wafer are bonded after chemical mechanical polishing (CMP) processes being performed on the dies and the semiconductor wafer. Dishing may occur on Cu bond pads, and the roughness of the dielectric material surrounding the Cu bond pads has to achieve a surface roughness Ra<0.5 or else the Van der Waals force cannot be built during the first phase ($SiO_x$—$SiO_x$) of the hybrid bonding. Poor control of Cu bond pad dishing may also cause dielectric material delamination during the second phase (Cu—Cu diffusion) of the hybrid bonding. Alternatively stated, the hybrid bonding surface preparation is costly and with stringent limitations.

SUMMARY

In one or more embodiments, a semiconductor package includes a first semiconductor device, a second semiconductor device, and an alignment material. The first semiconductor device has a first bonding layer, and the first bonding layer includes a first bond pad contacting an organic dielectric material. The second semiconductor device has a second bonding layer, and the second bonding layer includes a second bond pad contacting the organic dielectric material. The alignment material is between the first bonding layer and the second bonding layer.

In one or more embodiments, a semiconductor package includes a first semiconductor device, a second semiconductor device, and a first area. The first semiconductor device has a first bonding layer. The first bonding layer includes a first bond pad contacting a dielectric material. The second semiconductor device has a second bonding layer. The second bonding layer includes a second bond pad contacting the dielectric material. The first semiconductor device is bonded to the second semiconductor device through the first bond pad, the second bond pad, and the dielectric material. The first area is defined by the first bond pad and the second bond pad. The first area includes a recess of the first bond pad, the second bond pad, or the combination thereof. The dielectric material conforms to a morphology of the first area.

In one or more embodiments, a method for manufacturing a semiconductor package includes the following operations: providing a first semiconductor device having a first bonding layer, the first bonding layer including a first bond pad contacting a dielectric material and protruding from a top surface of the dielectric material; providing a second semiconductor device having a second bonding layer, the second bonding layer including a second bond pad; and face-to-face bonding the first bond pad to the second bond pad.

BRIEF DESCRIPTION OF THE DRAWINGS

Aspects of the present disclosure are best understood from the following detailed description when read with the accompanying drawings. It is noted that various features may not be drawn to scale, and the dimensions of the various features may be arbitrarily increased or reduced for clarity of discussion.

FIG. 3B illustrates an enlarged bottom view of a portion of a semiconductor package in accordance with some embodiments of the present disclosure;

FIG. 8A, FIG. 8B, FIG. 8C, FIG. 8D, FIG. 8E, and FIG. 8E1 illustrate various operations in a method of manufacturing a semiconductor package in accordance with some embodiments of the present disclosure.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1A:
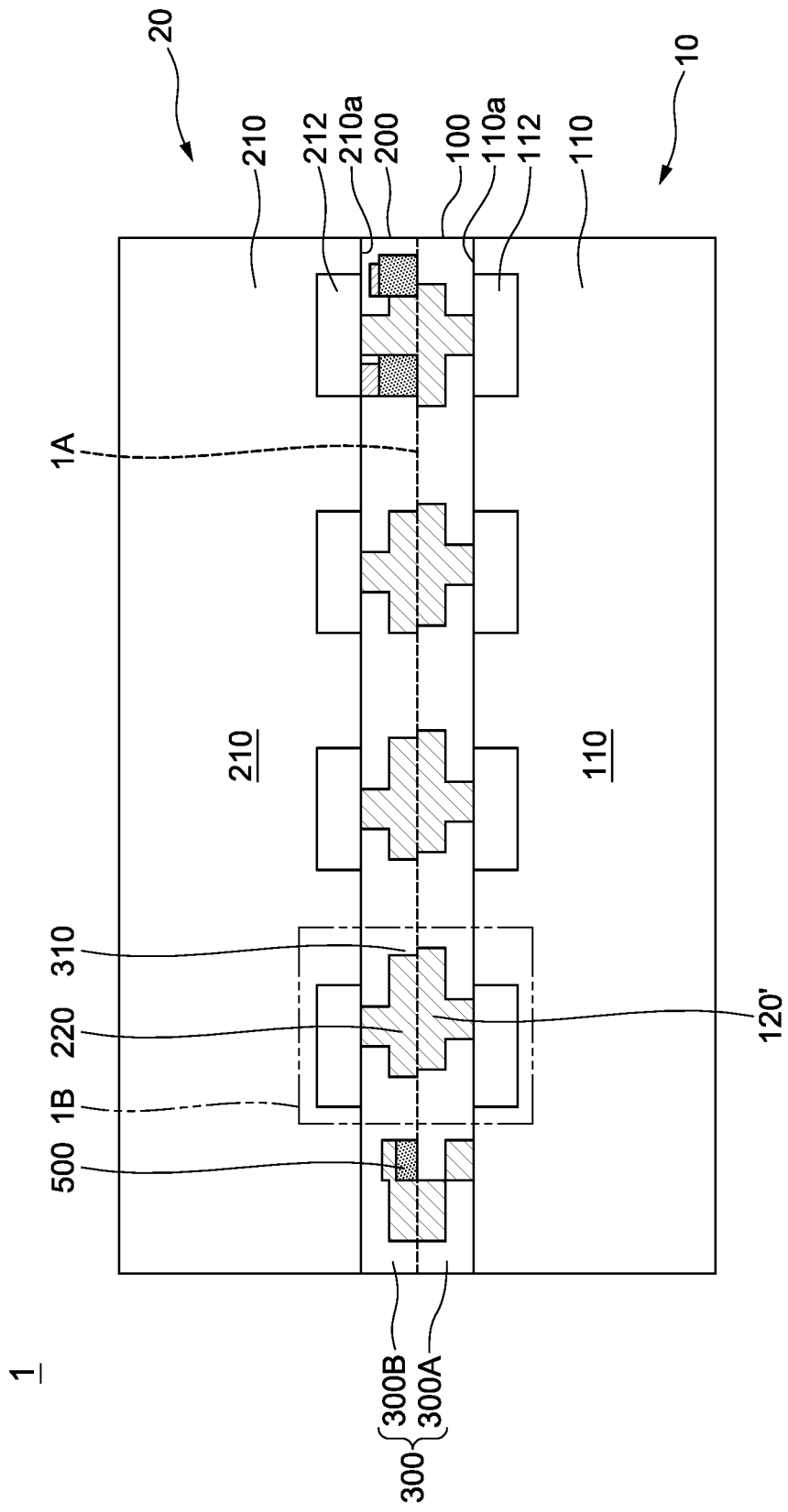
FIG. 1A illustrates a cross-sectional view of a semiconductor package in accordance with some embodiments of the present disclosure.

FIG. 1A illustrates a cross-sectional view of a semiconductor package 1 in accordance with some embodiments of the present disclosure. The semiconductor package 1 includes semiconductor devices 10 and 20, a dielectric material 300, an area 310, and an alignment mechanism 500.

In some embodiments, the semiconductor device 10 includes a substrate 110 and a bonding layer 100. The bonding layer 100 is disposed on a surface 110a (also referred to as "an upper surface") of the substrate 110. In some embodiments, the semiconductor device 20 includes a substrate 210 and a bonding layer 200. The bonding layer 200 is disposed on a surface 210a of the substrate 210.

The substrate 110 may be a semiconductor substrate, for example, a wafer or a die. The semiconductor substrate may include, for example but is not limited to, silicon (Si) or other suitable semi-conductive materials. In some embodiments, the substrate 110 includes one or more conductive pads 112 exposed from the surface 110*a* of the substrate 110. In some embodiments, the substrate 110 may include an interconnection structure, such as a plurality of conductive traces and a plurality of vias, connected to the one or more conductive pads 112. The substrate 110 may be or include a redistribution layer (RDL) or a grounding element.

In some embodiments, the bonding layer 100 includes bond pads 120'. In some embodiments, a pitch of the bond pads 120' is in a range of from about 10 μm to about 30 μm.

In some embodiments, the bond pad 120' is contacting the dielectric material 300. In some embodiments, the bond pad 120' is surrounded by the dielectric material 300. In some embodiments, the dielectric material 300 includes organic materials, polymeric materials, curable materials, resin-based material, or combinations thereof. In some embodiments, the bonding layer 100 may include a plurality of the bond pads 120'. In some embodiments, the bond pads 120' are connected to the conductive pads 112 of the substrate 110. In some embodiments, the bond pads 120' are electrically connected to the conductive pads 112 of the substrate 110. In some embodiments, the bond pad 120' may be, or include, a conductive material such as a metal or metal alloy. Examples include gold (Au), silver (Ag), aluminum (Al), copper (Cu), or an alloy thereof.

The substrate 210 may be a semiconductor substrate, for example, a wafer or a die. The semiconductor substrate may include, for example but is not limited to, silicon (Si) or other suitable semi-conductive materials. In some embodiments, the substrate 210 includes one or more conductive pads 212 exposed from the surface 210*a* of the substrate 210. In some embodiments, the substrate 210 may include an interconnection structure, such as a plurality of conductive traces and a plurality of vias, connected to the one or more conductive pads 212. The substrate 210 may be or include a redistribution layer (RDL) or a grounding element.

In some embodiments, the bonding layer 200 includes bond pads 220. In some embodiments, a pitch of the bond pads 220 is in a range of from about 10 μm to about 30 μm.

In some embodiments, the bond pad 220 is contacting the dielectric material 300. In some embodiments, the bond pad 220 is surrounded by the dielectric material 300. In some embodiments, the dielectric material 300 includes organic materials, polymeric materials, curable materials, resin-based material, or combinations thereof. In some embodiments, the bond pad 220 is contacting or surrounded by the portion 300B of the dielectric material 300. In some embodiments, the bonding layer 200 may include a plurality of the bond pads 220. In some embodiments, the bond pads 220 are connected to the conductive pads 212 of the substrate 210. In some embodiments, the bond pads 220 are electrically connected to the conductive pads 212 of the substrate 210. In some embodiments, the bond pad 220 may be, or include, a conductive material such as a metal or metal alloy. Examples include Au, Ag, Al, Cu, or an alloy thereof.

The bonding technique described in the present disclosure is particularly useful when a pitch of the bond pads 120'/220 is less than 30 μm, for example, between 10 μm and 30 μm. In some embodiments, when the pitch of the bond pads 120' and the pitch of the bond pads 220 is greater than about 30 μm, the bond pads 120' can be bonded to the bond pads 220 either by soldering or by direct pad-to-pad bonding (or pillar-to-pillar bonding) and followed by underfill filling to seal or protect the metal bondings. Since the pitch of the bond pads 120' and 220 is greater than about 30 μm, the gaps between the bond pads 120' and 220 and the gaps between the opposing bonding surfaces allow the underfill having a filler size greater than about 20 μm to enter and spread through the gaps via capillary force. In other embodiments, when the pitch of the bond pads 120' and the pitch of the bond pads 220 is less than about 10 μm, the gaps between the bond pads 120' and the bond pads 220 are too small for the underfill having a filler size greater than about 20 μm to enter and spread through therein, and bridging problem may occur when the bond pads 120' are bonded to the bond pads 220 by soldering. Thus, the bonding between the semiconductor devices 10 and 20 may be accomplished by conventional hybrid bonding technique, namely the polished surfaces of the inorganic dielectric materials respectively from the semiconductor devices 10 and 20 are bonded (i.e., the first phase ($SiO_x$—$SiO_x$) of the hybrid bonding). In addition, since the pitch of the bond pads is less than about 10 μm, the diameter of the bond pad is relatively small or about the same dimension as the pitch, and thus the dishing occurred on the polished surfaces of the bond pads is less severe. The conventional hybrid bonding technique is then followed by the second phase of Cu—Cu diffusion with a suitable annealing operation.

In some other embodiments, when the pitch of the bond pads 120' and the pitch of the bond pads 220 is in a range of from about 10 μm to about 30 μm, the bond pads 120' may be bonded to the bond pads 220 by soldering. However, since the pitch of the bond pads 120' and the pitch of the bond pads 220 is relatively small, soldering bridge problem may occur. In addition, in some alternative embodiments, the bond pads 120' may be bonded to the bond pads 220 by direct pad-to-pad bonding (or pillar-to-pillar bonding) followed by underfill filling when the pitch of the bond pads 120' and the pitch of the bond pads 220 is in a range of from about 10 μm to about 30 μm. However, the gaps between the bond pads may be too small for the underfill having a large filler size to fill in.

In view of the above, in some embodiments, when the pitch of the bond pads 120' and the pitch of the bond pads 220 is in a range of from about 10 μm to about 30 μm, currently no default solution to form the bonding of the pitch range set forth because it would be difficult to bond the semiconductor devices 10 and 20 by soldering due to bridging problem or by direct pad-to-pad bonding (or direct pillar-to-pillar bonding) followed by filling the gaps (e.g., less than 20 μm) between the opposing bonding surfaces by an underfill due to the large filler size. On the other hand, for bond pads having a pitch from about 10 μm to about 30 μm, the dishing occurred on the polished surfaces of the bond pads may be relatively significant, and the polished surfaces of the dielectric materials may have a relatively high surface roughness Ra (e.g., greater than about 10 nm) that can adversely affect the strength of the Van der Waals force during the first phase ($SiO_x$—$SiO_x$) of the hybrid bonding, and thus dielectric material delamination may easily occur during the bonding of the bond pads (i.e., the second phase (Cu—Cu diffusion) of the hybrid bonding). In other words, none of the conventional hybrid bonding technique, direct pad-to-pad (or direct pillar-to-pillar) technique, or soldering can provide satisfactory bonding quality between the semiconductor devices 10 and 20 when the pitch of the bond pads 120' and the pitch of the bond pads 220 are in a range of from about 10 μm to about 30 μm. In addition, despite that the semiconductor devices 10 and 20 with the pitch of the bond pads 120' and the pitch of the bond pads 220 being less than about 10 μm can be bonded by conventional hybrid bonding technique, stringent hybrid bonding limitations (e.g., dielectric surface roughness Ra<0.5 nm, Cu bond pad dishing within 3 nm to 5 nm) between conventional hybrid bonding layers are required to achieve a satisfactory bonding quality.

According to some embodiments of the present disclosure, the bonding layer 100 includes the bond pad 120' which is contacting or surrounded by the dielectric material 300, and the bonding layer 100 can be bonded to the opposing bonding layer 200 by a thermal compression operation, allowing the inter-diffusion between the conductive materials (e.g., metal atoms, such as Cu atoms) of the bond pad 120' and the bond pad 220 from the opposing bonding layer 200 to occur prior to the dielectric coalition. Therefore, dielectric material delamination caused by poor dielectric surface roughness can be prevented, thus the bonding strength between the bonding layer 100 and the bonding layer 200 can be increased, and the as-formed bonding structure including the bonding layer 100 and the bonding layer 200 can be relatively stable. Therefore, the problem of stringent hybrid bonding limitations (e.g., dielectric surface roughness Ra<0.5 nm, Cu bond pad dishing within 3 nm to 5 nm) between conventional hybrid bonding layers can be solved by preparing the bonding layer 100 including the bond pad 120' which is contacting or surrounded by the dielectric material 300, and the dielectric material 300 may have a surface roughness Ra around 10 nm to 20 nm. In addition, with the process window for the dielectric surface roughness being increased (e.g., from Ra<0.5 to around 10 nm to 20 nm), the dielectric material 300 can be treated with a grinding apparatus instead of a CMP apparatus, and thus the manufacturing process is relatively less costly and simplified, which is also advantageous to the improvement of the mass production process yield.

In some embodiments, the dielectric material 300 is disposed on the surface 110a of the substrate 110. In some embodiments, a coefficient of thermal expansion (CTE) of the dielectric material 300 is greater than a CTE of the bond pad 120. According to some embodiments of the present disclosure, by adopting the dielectric material 300 having the aforesaid design (e.g., the specific CTE criteria of the dielectric material 300), the portions 300A and 300B of the dielectric material 300 can expand upon heating to form the nearly seamless dielectric material 300, and the problem of voids existed at the area 310 of the bond pads of the bonding layers can be solved, so that the dielectric material 300 can better conform to the morphology of the area 310 of the bond pads 120' and 220 after a bonding operation, which is advantageous to the improvement of bonding strength. In addition, according to some embodiments of the present disclosure, by adopting the dielectric material 300 having the aforesaid design (e.g., the specific CTE criteria of the dielectric material 300), the portions 300A and 300B of the dielectric material 300 can expand upon heating so as to form a nearly seamless structure that contacts or surrounds the bond pads 120' and 220 having pitches from about 10 μm to about 30 μm. Therefore, dielectric material delamination caused by poor dielectric surface roughness can be prevented, and thus the bonding strength between the bonding layer 100 and the bonding layer 200 can be increased.

In some embodiments, the dielectric material 300 includes a benzocyclobutene-containing resin (BCB-containing resin) or a BCB derivative resin. In some embodiments, the dielectric material 300 includes a BCB-containing siloxane resin or a BCB derivative siloxane resin. In some embodiments, the dielectric material 300 includes a copolymer or polymer formed from one or more polymeric monomers including benzo-cycloalkyl ethylene moieties. In some embodiments, the dielectric material 300 includes a copolymer or polymer formed from one or more polymeric monomers including a compound represented by the following formula:

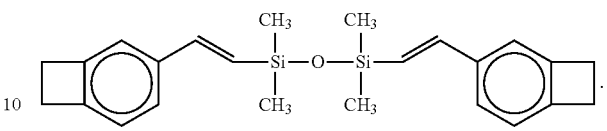

In some embodiments, the dielectric material 300 includes a polymeric material including repeating units having benzo-cycloalkyl siloxane groups.

According to some embodiments of the present disclosure, the dielectric material 300 includes the aforesaid material(s), and thus the dielectric material 300 may be formed of a polymeric material having a relatively high degree of crosslinking, and thus the dielectric material 300 can better conform to the morphology of the bond pads, and the bonding strength provided by the dielectric material 300 can be relatively high. In addition, according to some embodiments of the present disclosure, the benzo-cycloalkyl ethylene moieties of the polymeric monomers can undergo a Diels-Alder reaction to form a highly crosslinked structure, and thus the bonding strength provided by the dielectric material 300 can be relatively high.

In some embodiments, the dielectric material 300 includes a portion 300A and a portion 300B connected to the portion 300A. In some embodiments, the portion 300A of the dielectric material 300 is substantially aligned with the portion 300B of the dielectric material 300.

According to some embodiments of the present disclosure, the portion 300A and the portion 300B of the dielectric material 300 both include a copolymer or polymer formed from one or more polymeric monomers including benzo-cycloalkyl ethylene moieties, and thus the benzo-cycloalkyl ethylene moieties from the portion 300A and the benzo-cycloalkyl ethylene moieties from the portion 300B can readily undergo a Diels-Alder reaction, so as to form a highly crosslinked polymeric structure between the portion 300A and the portion 300B of the dielectric material 300. Therefore, compared with the cases where layers of dielectric materials (e.g., $SiO_x$) are bonded through building up Van der Waals force followed by forming covalent bonds between the layers of dielectric materials, the highly crosslinked polymeric structure provides a greater bonding strength than that of covalent bonds, and thus the bonding strength provided by the dielectric material 300 is increased significantly.

In some embodiments, the semiconductor device 10 is bonded to the semiconductor device 20 through the bond pad 120', the bond pad 220, and the dielectric material 300. In some embodiments, a bonding interface 1A may be formed between the portion 300A and the portion 300B of the dielectric material 300. In some embodiments, the bond pad 120' and the bond pad 220 may be formed integrally and free from a bonding interface between the bond pad 120' and the bond pad 220.

In some embodiments, the dielectric material 300 is disposed between the surface 110a of the substrate 110 and the surface 210a of the substrate 210. In some embodiments, the CTE of the dielectric material 300 is greater than a CTE of the bond pad 220.

In some embodiments, the alignment mechanism 500 (or an alignment material) is between the bonding layer 100 and the bonding layer 200. In some embodiments, the alignment mechanism 500 includes a plurality of portions disposed dispersedly between the bonding layer 100 and the bonding layer 200. In some embodiments, the alignment mechanism 500 surrounds the bond pads 120'. In some embodiments, the alignment mechanism 500 surrounds the bond pads 220. In some embodiments, the alignment mechanism 500 includes a plurality of portions located in a peripheral region that surrounds the bond pads 120'. In some embodiments, the alignment mechanism 500 includes a plurality of portions located in a peripheral region that surrounds the bond pads 220. In some embodiments, the alignment mechanism 500 is adjacent to the bonding interface 1A between the bonding layer 100 and the bonding layer 200. In some embodiments, the alignment mechanism 500 and the bond pads 120' include different materials. In some embodiments, the alignment mechanism 500 and the bond pads 220 include different materials. In some embodiments, the alignment mechanism 500 includes a soldering material.

According to some embodiments of the present disclosure, by forming the alignment mechanism 500 on the bond pads 120'/220 which self-aligns the bond pads 120'/220 at an opposing bonding layer, a plurality of first semiconductor devices can be aligned with a semiconductor wafer having a plurality of device regions corresponding to the plurality of the first semiconductor devices, for example, during a gang bond operation (which will be discussed in details hereinafter), and the dielectric material 300 can serve to pre-build a sealing or protecting material on the bonding layers and subsequently expand to form a seamless filling material contacting or surrounding the bond pads 120' and 220 and the alignment mechanism 500. Therefore, a die-to-wafer bonding or even wafer-to-wafer bonding can be realized, the production throughput or unit per hour (UPH) of the semiconductor packages can be increased, and thus the problem of low throughput for a batch process of bonding dies/wafers by conventional hybrid bonding technique or direct pad-to-pad bonding (or direct pillar-to-pillar bonding) may be solved.

In some embodiments, the alignment mechanism 500 is spaced apart from the substrate 110 of the semiconductor device 10. In some embodiments, the alignment mechanism 500 is spaced apart from the substrate 210 of the semiconductor device 20.

In some embodiments, the area 310 is defined by the bond pad 120' and the bond pad 220. Alternatively stated, the area 310 is the portion of the bond pad 120' or the portion of the bond pad 220 that is not in contact with the opposing bond pad but in contact with the dielectric material 300. In some embodiments, the dielectric material 300 conforms to a morphology of the area 310.

Figure 1B:
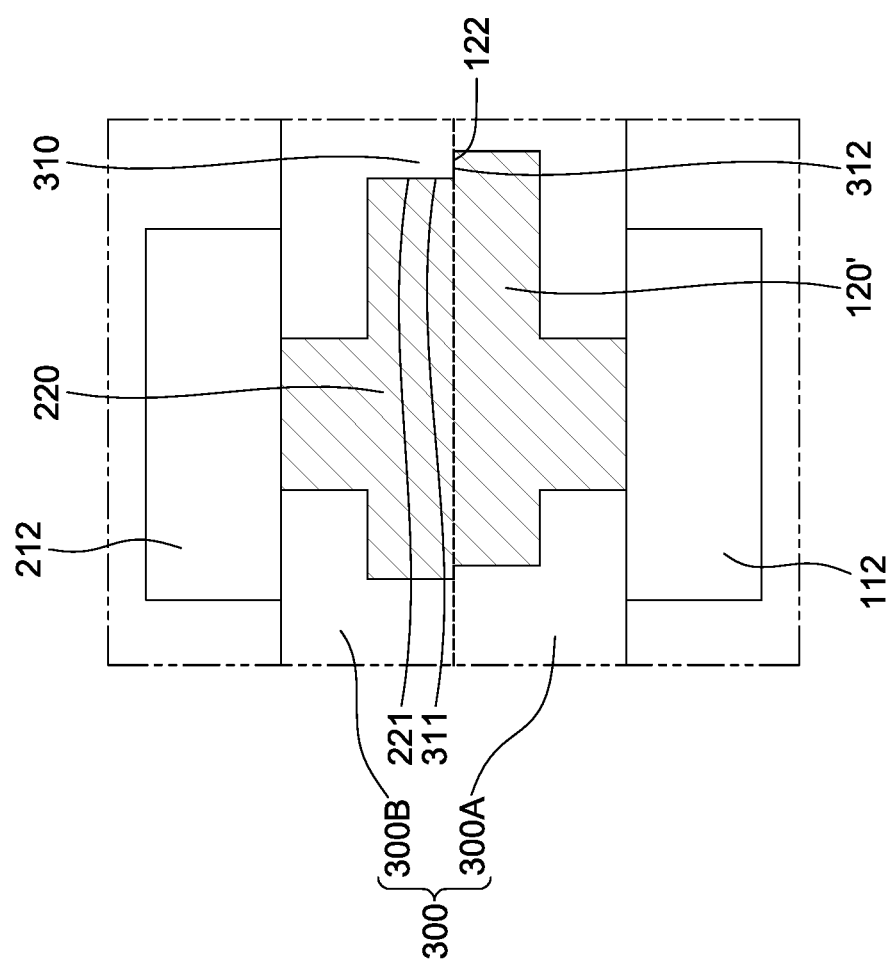
FIG. 1B illustrates an enlarged bottom view of a portion of a semiconductor package in accordance with some embodiments of the present disclosure.

FIG. 1B illustrates an enlarged bottom view of a portion of a semiconductor package 1 in accordance with some embodiments of the present disclosure. In some embodiments, FIG. 1B illustrates a cross-sectional view of the structure shown in the dashed box 1B in FIG. 1A.

In some embodiments, the area 310 is defined by a surface 221 of the bond pad 220 and a surface 122 of the bond pad 120', and the surface 221 is angled with the surface 122. In some embodiments, an angle between the surface 221 and the surface 122 of the area 310 is equal to or less than about 90°. In some embodiments, the area 310 is defined by a surface 311 and a surface 312 of the dielectric material 300, and the surface 311 is angled with the surface 312. In some embodiments, an angle between the surface 311 and the surface 312 of the area 310 is equal to or less than about 90°.

Figure 2:
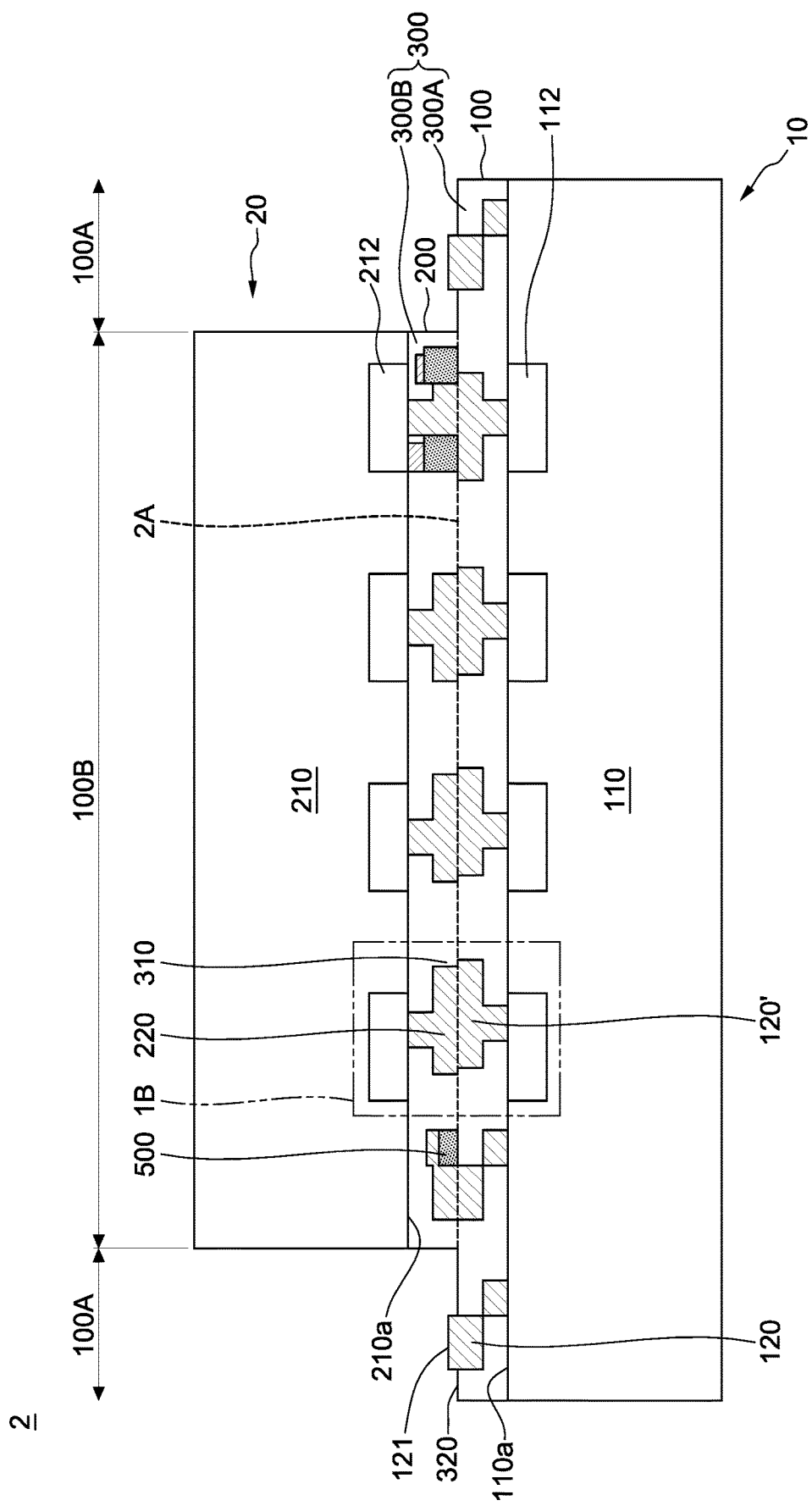
FIG. 2 illustrates a cross-sectional view of a semiconductor package in accordance with some embodiments of the present disclosure.

FIG. 2 illustrates a cross-sectional view of a semiconductor package 2 in accordance with some embodiments of the present disclosure. The semiconductor package 2 is similar to the semiconductor package 1 in FIG. 1A except that, for example, the bonding layer 100 has a different structure.

In some embodiments, the bonding layer 100 includes a bonding region 100B and a non-bonding region 100A. In some embodiments, the bonding layer 100 includes bond pads 120 and 120'. In some embodiments, a pitch of the bond pads 120 and 120' is in a range of from about 10 μm to about 30 μm. In some embodiments, the bond pad 120 and 120' may be, or include, a conductive material such as a metal or metal alloy. Examples include Au, Ag, Al, Cu, or an alloy thereof.

In some embodiments, the bond pad 120 is contacting or surrounded by the dielectric material 300 in the non-bonding region 100A. In some embodiments, the bond pad 120 protrudes from a surface 320 (also referred to as "a top surface" or "an upper surface") of the dielectric material 300. In some embodiments, a surface 121 (also referred to as "a top surface" or "an upper surface") of the bond pad 120 protrudes from the surface 320 of the dielectric material 300. In some embodiments, the surface 121 of the bond pad 120 has a dishing from about 3 nm to about 5 nm. In some embodiments, the bonding layer 100 may include a plurality of the bond pads 120 in the non-bonding region 100A.

In some embodiments, the bonding layer 100 includes bond pads 120 and 120' and the portion 300A of the dielectric material 300. In some embodiments, an upper surface (i.e., the surface 320) of the portion 300A is exposed from the portion 300B of the dielectric material 300. In some embodiments, the bond pad 120 is contacting or surrounded by the portion 300A of the dielectric material 300 in the non-bonding region 100A. In some embodiments, the surface 121 (also referred to as "the top surface" or "the upper surface") of the bond pad 120 protrudes from the surface 320 of the portion 300A of the dielectric material 300. In some embodiments, the bond pad 120' is contacting or surrounded by the portion 300A of the dielectric material 300 in the bonding region 100B.

In some embodiments, a surface roughness at the surface 320 (also referred to as "the top surface" or "the upper surface") of the dielectric material 300 in the non-bonding region 100A is in a range of from about 10 nm to about 20 nm. In some embodiments, a surface roughness at the surface 320 of the portion 300A of the dielectric material 300 in the non-bonding region 100A is in a range of from about 10 nm to about 20 nm. In some embodiments, the substrate 110 may be a semiconductor wafer, and the semiconductor device 10 may be wafer-level semiconductor device. In some embodiments, the substrate 210 may be a semiconductor die. In some embodiments, a plurality of the semiconductor devices 20 (not shown in FIG. 2) may be bonded to the semiconductor device 10 exposing the non-bonding region 100A.

In some embodiments, the alignment mechanism 500 and the bond pads 120 include different materials.

Figure 3A:
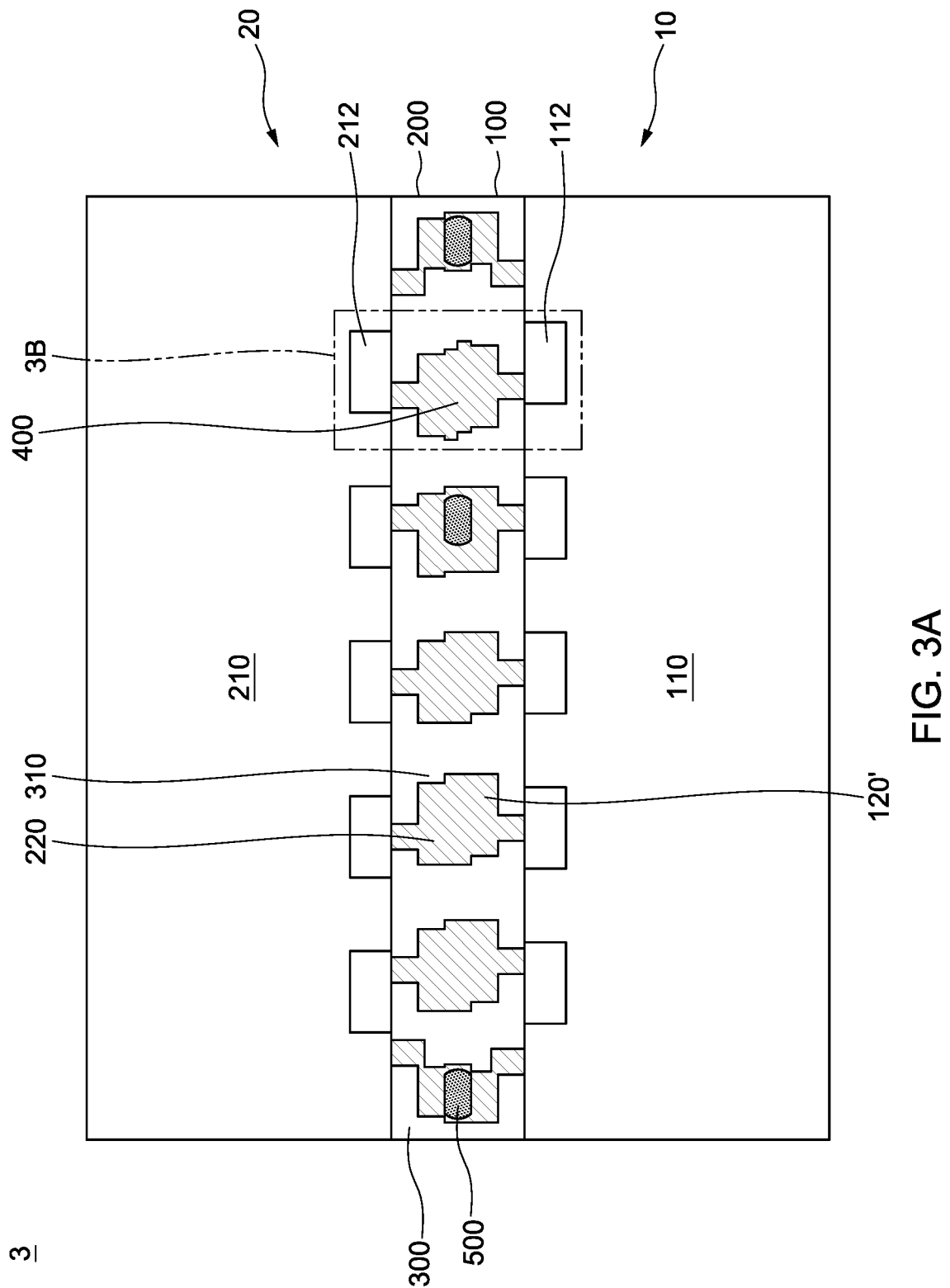
FIG. 3A illustrates a cross-sectional view of a semiconductor package in accordance with some embodiments of the present disclosure.

FIG. 3A illustrates a cross-sectional view of a semiconductor package 3 in accordance with some embodiments of the present disclosure. The semiconductor package 3 is similar to the semiconductor package 1 in FIG. 1A except that, for example, the semiconductor package 3 further includes a plated material 400.

In some embodiments, the plated material 400 is between the bonding layer 100 and the bonding layer 200. In some embodiments, the plated material 400, the bond pad 120' and the bond pad 220 are formed integrally as a monolithic structure. In some embodiments, the bond pad 220 and the plated material 400 define the area 310. In some embodiments, the bond pad 120' and the plated material 400 define the area 310. In some embodiments, the semiconductor device 10 is bonded to the semiconductor device 20 through the bond pad 120', the bond pad 220, the plated material 400, and the dielectric material 300. In some embodiments, the plated material 400 may be, or include, a conductive material such as a metal or metal alloy. Examples include Au, Ag, Al, Cu, or an alloy thereof. In some embodiments, the plating material 400 may be or include an electro-plated material or an electroless plated material.

In some embodiments, the plated material 400 directly contacts the alignment mechanism 500. In some embodiments, the plated material 400 includes a plurality of portions each between one bond pad 120' and one bond pad 220. In some embodiments, the alignment mechanism 500 is spaced apart from the dielectric material 300 by the plated material 400.

FIG. 3B illustrates an enlarged bottom view of a portion of a semiconductor package 3 in accordance with some embodiments of the present disclosure. In some embodiments, FIG. 3B illustrates a cross-sectional view of the structure shown in the dashed box 3B in FIG. 3A.

In some embodiments, the plated material 400 contacts a surface 123 (also referred to as "a sidewall") of the bond pad 120'. In some embodiments, the plated material 400 contacts a surface 221 (also referred to as "a sidewall") of the bond pad 220. In some embodiments, the plated material 400 contacts the dielectric layer 300. In some embodiments, the bond pad 120' is bonded to the bond pad 220 through the plated material 400.

Figure 4A:
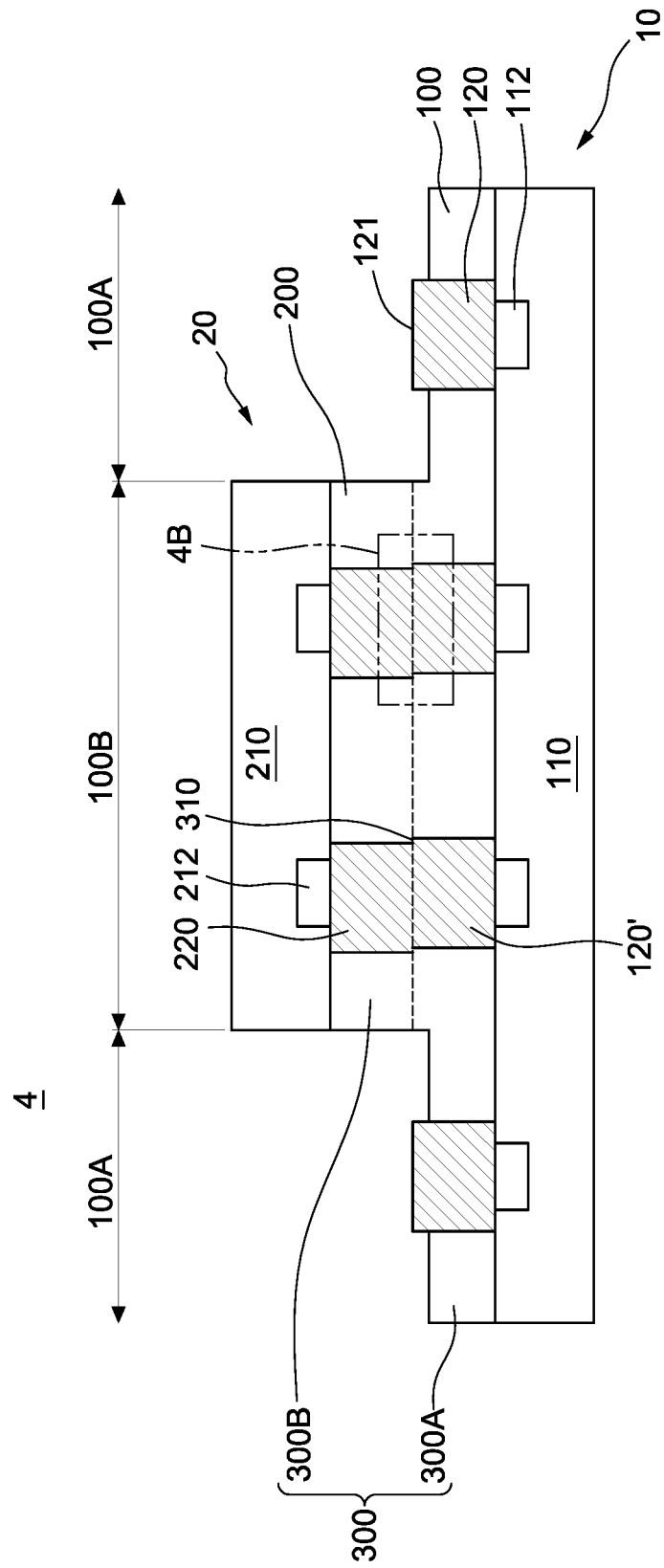
FIG. 4A illustrates a cross-sectional view of a semiconductor package in accordance with some embodiments of the present disclosure.

FIG. 4A illustrates a cross-sectional view of a semiconductor package 4 in accordance with some embodiments of the present disclosure. The semiconductor package 4 is similar to the semiconductor package 1 in FIG. 1A except that, for example, the semiconductor package 4 is free from an alignment mechanism 500.

Figure 4B:
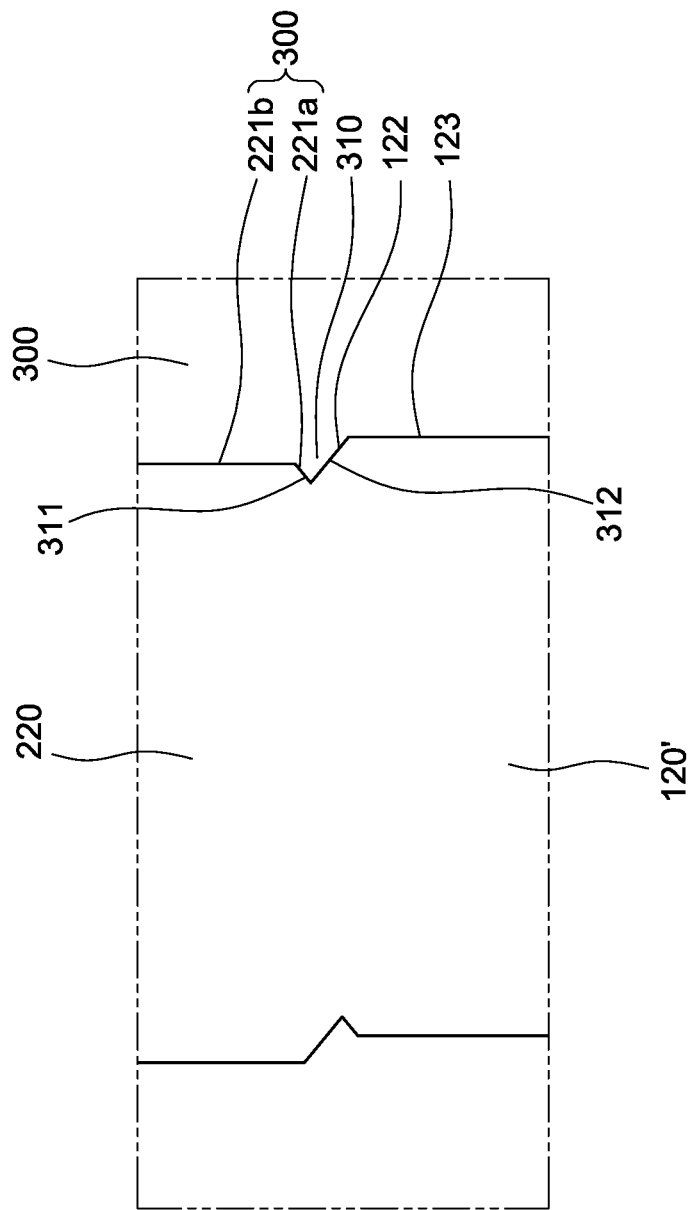
FIG. 4B illustrates an enlarged bottom view of a portion of a semiconductor package in accordance with some embodiments of the present disclosure.

FIG. 4B illustrates an enlarged bottom view of a portion of a semiconductor package 4 in accordance with some embodiments of the present disclosure. In some embodiments, FIG. 4B illustrates a cross-sectional view of the structure shown in the dashed box 4B in FIG. 4A.

In some embodiments, the bond pad 220 has a sidewall (i.e. the surface 221) including a surface 221b and a surface 221a angled with the surface 221b. In some embodiments, the surface 122 of the bond pad 120' is connected to the surface 221a of the bond pad 220. In some embodiments, the area 310 extends towards inside of the bond pad 120' and the bond pad 220. In some embodiments, the dielectric material 300 conforms to a morphology of the area 310.

In some embodiments, the area 310 is defined by the surface 221a of the bond pad 220 and the surface 122 of the bond pad 120', and the surface 221a is angled with the surface 122. In some embodiments, an angle between the surface 221a and the surface 122 of the area 310 is less than about 90°. In some embodiments, the angle between the surface 221a and the surface 122 of the area 310 is equal to or less than about 80°. In some embodiments, the area 310 is defined by the surface 311 and the surface 312 of the dielectric material 300, and the angle between the surface 311 and the surface 312 of the area 310 is equal to or less than about 90°. In some embodiments, the angle between the surface 311 and the surface 312 of the area 310 is equal to or less than about 80°.

FIG. 5A, FIG. 5B, FIG. 5C, FIG. 5D, FIG. 5E, FIG. 5F, FIG. 5G and FIG. 5H illustrate various operations in a method of manufacturing a semiconductor package 2 in accordance with some embodiments of the present disclosure.

Figure 5A:
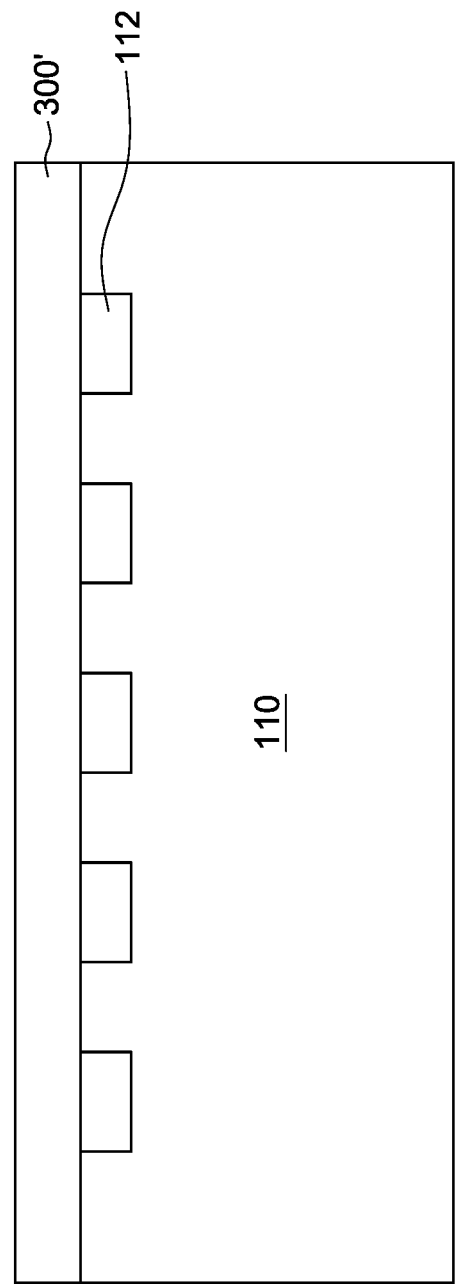
FIG. 5A, FIG. 5B, FIG. 5C, FIG. 5D, FIG. 5E, FIG. 5F, FIG. 5G and FIG. 5H illustrate various operations in a method of manufacturing a semiconductor package in accordance with some embodiments of the present disclosure.

A semiconductor device 10 is provided. The semiconductor device 10 may be provided by the operations illustrated in FIGS. 5A-5C. Referring to FIG. 5A, a substrate 110 including conductive pads 112 is provided, and a dielectric material 300' is formed on the substrate 110. In some embodiments, the dielectric material 300' includes a benzo-cyclobutene-containing resin (BCB-containing resin) or a BCB derivative resin. In some embodiments, the dielectric material 300' includes a BCB-containing siloxane resin or a BCB derivative siloxane resin. In some embodiments, the dielectric material 300' includes a copolymer or polymer formed from one or more polymeric monomers including benzo-cycloalkyl ethylene moieties. In some embodiments, the dielectric material 300' includes one or more polymeric monomers including a compound represented by the following formula:

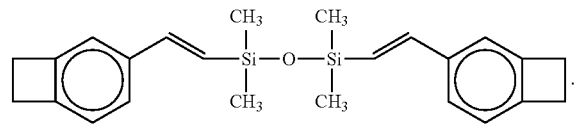

Figure 5B:
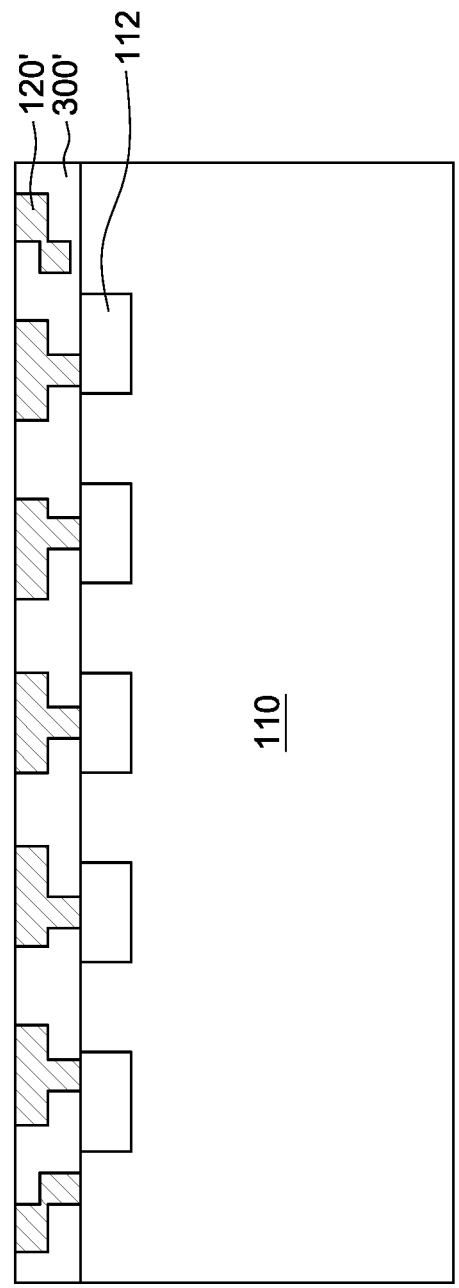

Referring to FIG. 5B, bond pads 120' are formed on the substrate 110. In some embodiments, the bond pads 120' are formed within the dielectric material 300. In some embodiments, the bond pads 120' are contacting or surrounded by the dielectric material 300'. In some embodiments, the CTE of the dielectric material 300' is greater than the CTE of the bond pad 120'.

Figure 5C:
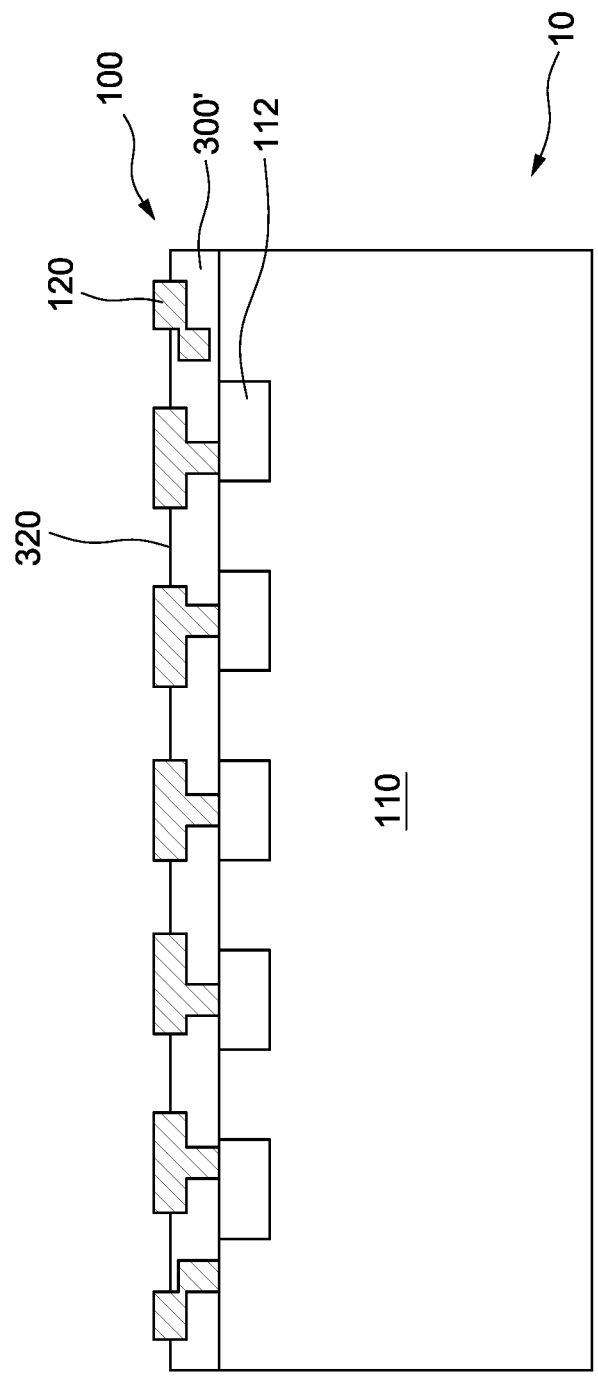

Referring to FIG. 5C, the bond pads 120' and the dielectric material 300' are treated so that the bond pads 120' are protruding from a top surface 320 of the dielectric material 300'. In some embodiments, treating the bond pads 120' and the dielectric material 300' may include etching back the dielectric material 300' by hydrogen peroxide. In some embodiments, treating the bond pads 120' and the dielectric material 300' may include performing a chemical mechanical polishing (CMP) process on the bond pads 120' and the dielectric material 300' with a slurry having a higher etching rate on the dielectric material 300' than that on the bond pads 120'. In some embodiments, treating the bond pads 120' and the dielectric material 300' is performed until the bond pads 120' are protruding from the top surface 320 of the dielectric material 300' by greater than about 5 nm, for example, a range of from about 10 nm to about 20 nm. As such, a bonding layer 100 of the semiconductor device 10 is formed.

Figure 5D:
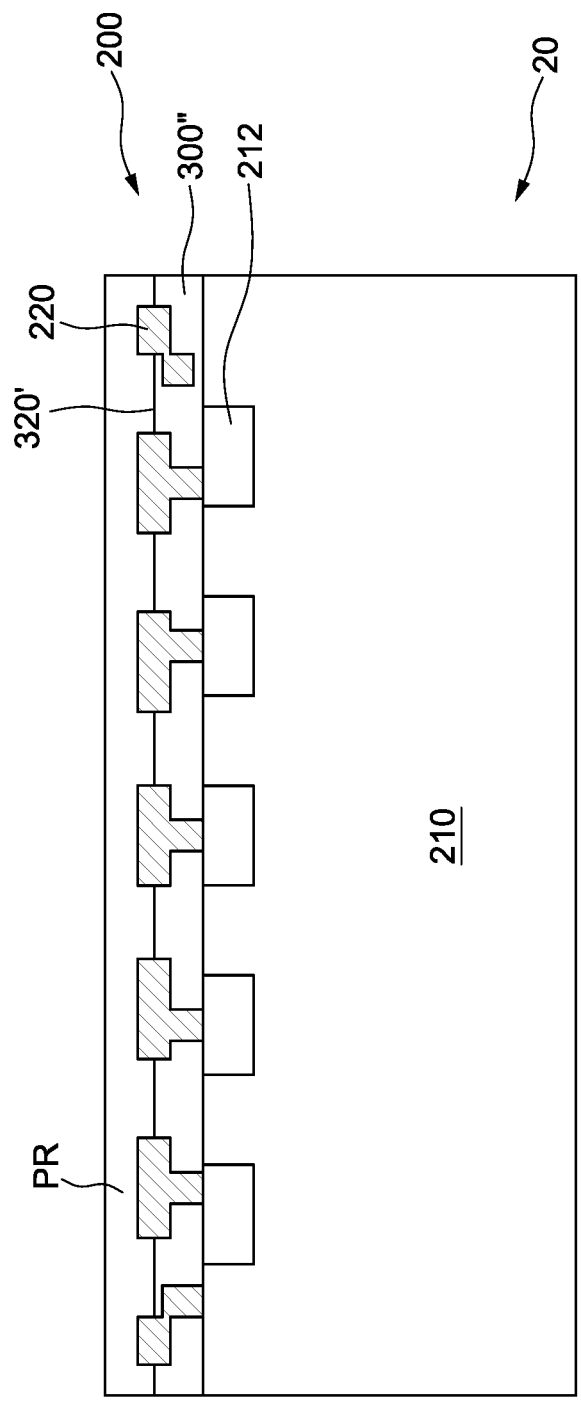

Referring to FIG. 5D, a semiconductor device 20 is provided. In some embodiments, providing the semiconductor device 20 may include providing a substrate 210 including conductive pads 212, forming a dielectric material 300" is on the substrate 210, and treating the bond pads 220 and the dielectric material 300" so that the bond pads 220 are protruding from a top surface 320' of the dielectric material 300". As such, a bonding layer 200 of the semiconductor device 20 is formed. Next, a photoresist PR is formed on the bond pads 220 and the dielectric material 300". In some embodiments, the dielectric material 300" is made of or includes a material similar to that of the dielectric material 300'. In some embodiments, the bond pads 220 and the dielectric material 300" are treated by operations similar to those for treating the bond pads 120' and the dielectric material 300' as illustrated in FIG. 5C.

Figure 5E:
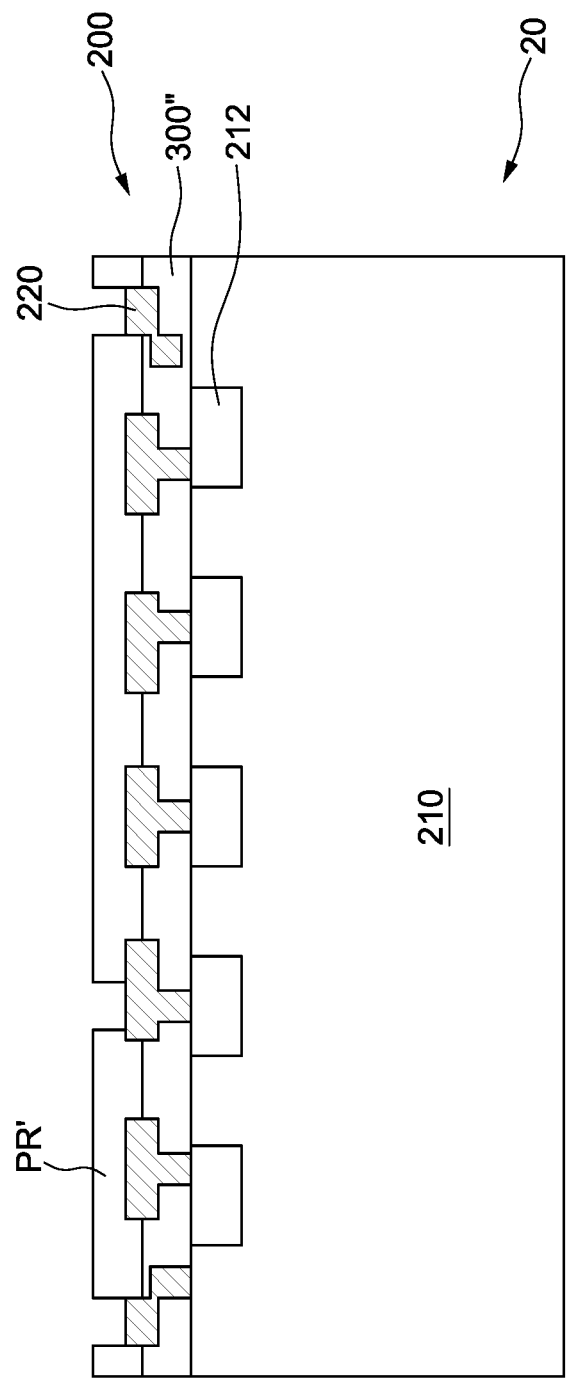

Referring to FIG. 5E, the photoresist PR is patterned to form a patterned photoresist PR' having openings exposing portions of the bond pads 220. In some embodiments, the exposed portions of the bond pads 220 define positions that are reserved for solder bumps 500A to be disposed thereon subsequently.

Figure 5F:
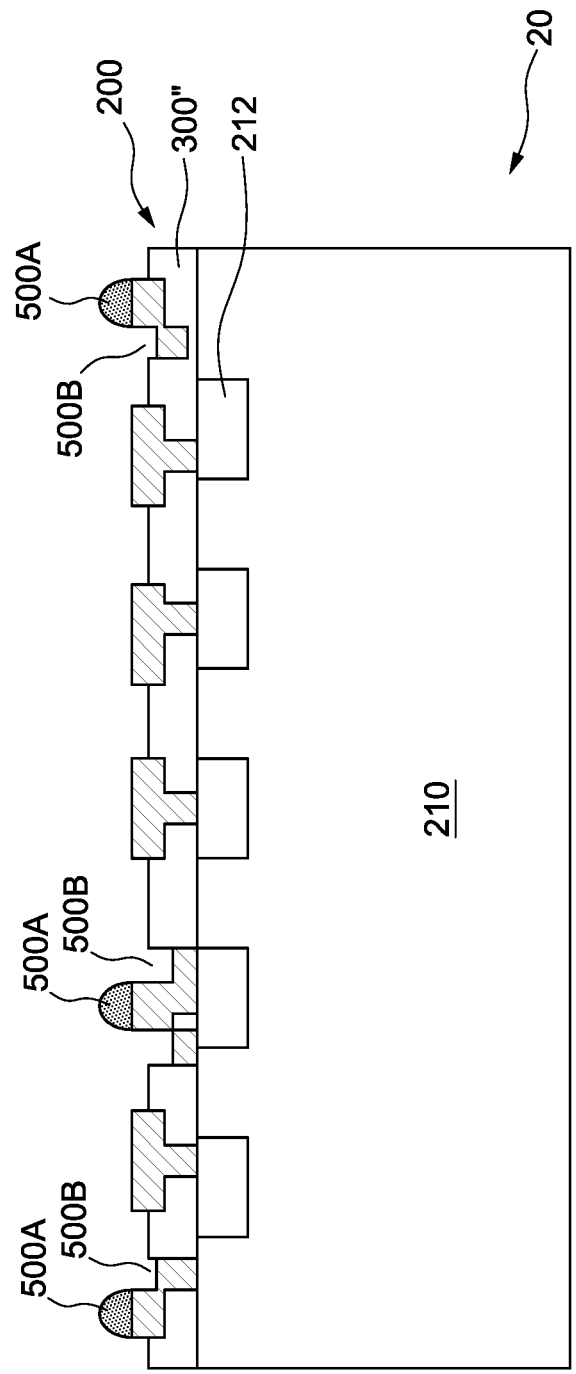

Referring to FIG. 5F, solder bumps 500A are formed on the semiconductor device 20. In some embodiments, the solder bumps 500A are formed on the positions of the bond pads 220 exposed from the patterned photoresist PR'. In some embodiments, the patterned photoresist PR' is removed after the solder bumps 500A are formed.

Still referring to FIG. 5F, one or more notches 500B are formed in the dielectric material 300". In some embodiments, the notches 500B are formed adjacent to or nearby the solder bumps 500A. In some embodiments, the notches 500B are formed by applying laser on the dielectric material 300". In some embodiments, the notches 500B are formed by applying laser on some of the bond pads 220 on the dielectric material 300". In some embodiments, the notches 500B are formed by, for example, laser ablation. In some embodiments, portions of the bond pads 220 may be melted by the laser, and the melted portions of the bond pads 220 may be shifted to positions under the notches 500B.

In some embodiments, the substrate 110 may be a semiconductor wafer, and the solder bumps 500A may be formed on the semiconductor wafer prior to dicing the wafer-level substrate 210 to obtain a plurality of semiconductor devices 20. In some embodiments, solder bumps 500A and notches 500B adjacent to the solder bumps 500A may be formed on the bonding region 100B of the semiconductor device 10 (not shown in FIG. 5F).

Figure 5G:
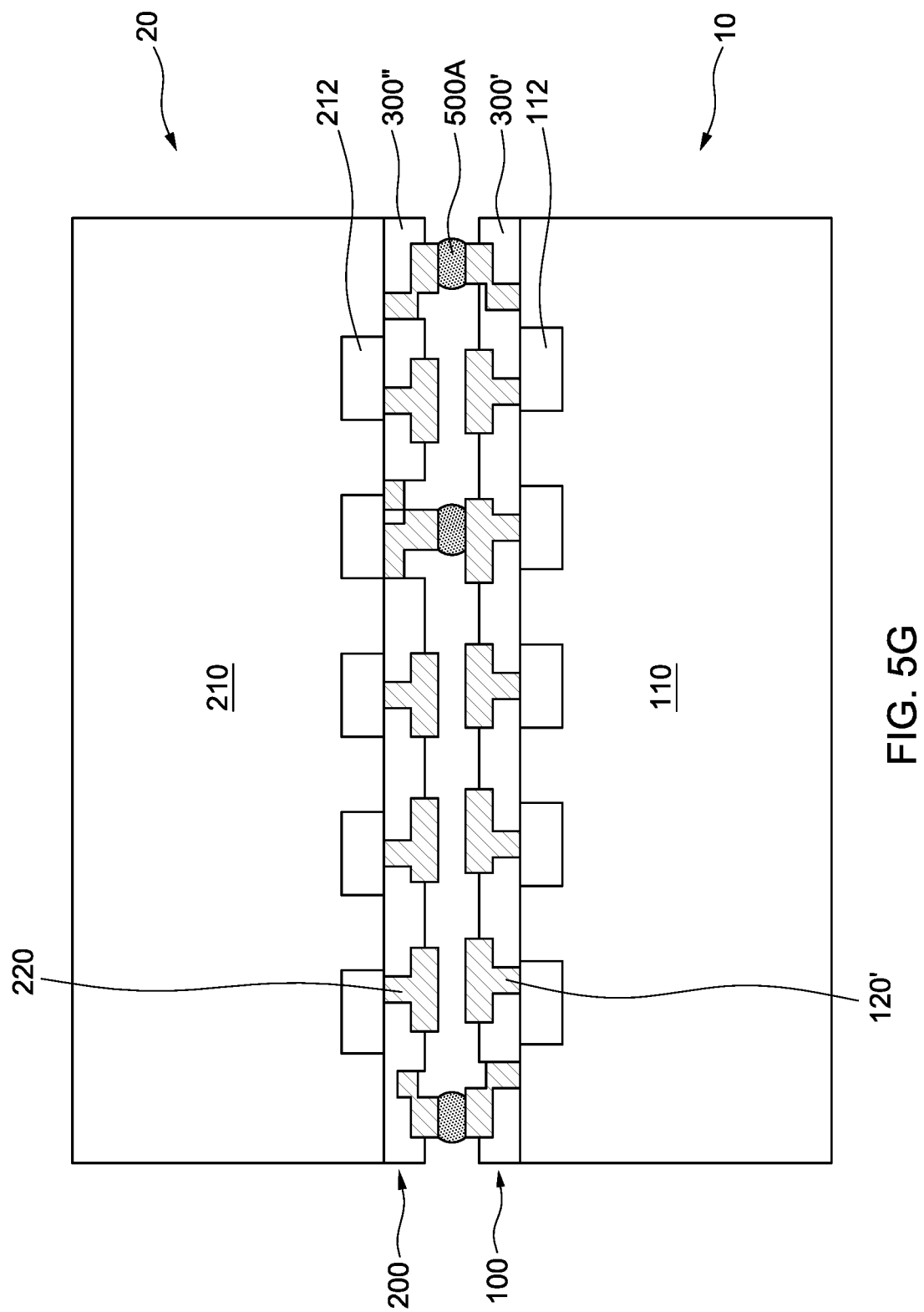

Referring to FIG. 5G, the semiconductor device 20 is bonded to the semiconductor device 10. In some embodiments, the bond pads 120' of the first bonding layer 100 are face-to-face bonded to the bond pads 220 of the second bonding layer 200. In some embodiments, the notches 500B are formed in the dielectric material 300" prior to bonding the semiconductor device 10 to the semiconductor device 20. In some embodiment, bonding the semiconductor device 20 to the semiconductor device 10 may include aligning the bond pads 120' and the bond pad 220 prior to bonding the bond pads 120' to the bond pads 220. In some embodiments, the bond pads 120' and the bond pad 220 are self-aligned through soldering between the bonding layer 100 and the bonding layer 200. In some embodiments, the bond pads 120' and the bond pad 220 are self-aligned through the solder bumps 500A. In some embodiments, bonding the semiconductor device 20 to the semiconductor device 10 may include self-aligning the semiconductor device 20 and the semiconductor device 10 through the solder bumps 500A. In some embodiments, the notch 500B is formed in the dielectric material 300 prior to the self-aligning. In some embodiments, the solder bumps 500A are formed on the semiconductor device 10 and/or 20 prior to the self-aligning. According to some embodiments of the present disclosure, by forming solder bumps 500A on the bond pads 120'/220 which align the bond pads 220/120' at an opposing bonding layer, the problem of low throughput for a batch process of hybrid bonding dies/wafers may be solved.

In some embodiments, the substrate 210 may be a semiconductor wafer, and the semiconductor wafer may be diced to obtain a plurality of semiconductor devices 20 prior to bonding the semiconductor device(s) 20 to the semiconductor device 10.

Figure 5H:
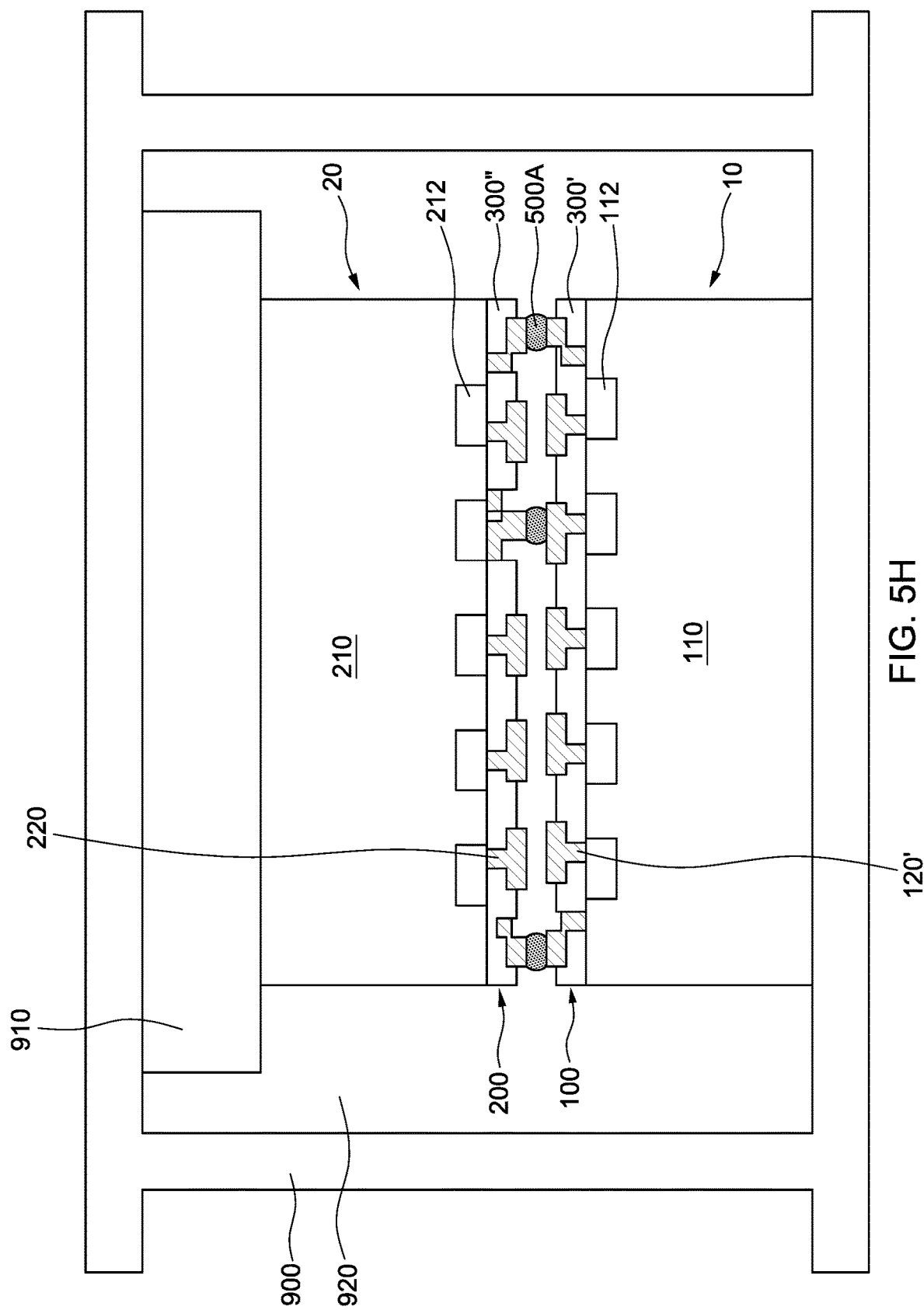

Referring to FIG. 5H, a thermal compression operation is performed to face-to-face bond the first bonding layer 100 and the second bonding layer 200, including completing the bonding between the bond pads 120' and the dielectric material 300' of the first bonding layer 100 to the bond pads 220 and the dielectric material 300" of the second bonding layer 200, respectively. In some embodiments, the bond pads 120' of the bonding layer 100 and the bond pads 220 of the bonding layer 200 are stressed so as to physically contact each other in the thermal compression operation. In some embodiments, the dielectric material 300' of the bonding layer 100 and the dielectric material 300" of the bonding layer 200 may expand and physically contact each other upon heating by the thermal compression operation. In some embodiments, a surface roughness of the dielectric material 300' is in a range of from about 10 nm to about 20 nm prior to the thermal compression operation. In some embodiments, a surface roughness of the dielectric material 300" is in a range of from about 10 nm to about 20 nm prior to the thermal compression operation.

In some embodiments, the solder bumps 500A are formed on the semiconductor device 10 and/or the semiconductor device 20 prior to performing the thermal compression operation. In some embodiments, self-aligning the semiconductor device 10 and the semiconductor device 20 through the solder bumps 500A is prior to performing the thermal compression operation.

In some embodiments, performing the thermal compression operation includes performing a gang bond operation. In some embodiments, the gang bond operation is performed at a temperature greater than about 200 degree Celsius and a pressure greater than about 100 N. In some embodiments, the gang bond operation is performed at a temperature from 200 degree Celsius to about 250 degree Celsius. In some embodiments, a duration of performing the gang bond operation is greater than about 10 minutes. In some embodiments, the gang bond operation is performed by a gang bond apparatus 900 including a gang bond head 910 and an enclosed chamber 920. In some embodiments, the gang bond apparatus 900 is a wafer-level gang bond apparatus where the gang bond is utilized in a die-to-wafer bonding operation. For example, the gang bond apparatus 900 is implemented to bond a plurality of first semiconductor devices with a semiconductor wafer having a plurality of device regions corresponding to the plurality of first semiconductor devices. The gang bond head 910 may contact the semiconductor device 20 and apply pressure (e.g., greater than about 100 N) on the semiconductor devices 10 and 20. In some embodiments, the pressure inside the chamber 920 may be adjusted to be a predetermined pressure, for example, lower than about 1 atm.

According to some embodiments of the present disclosure, the solder bumps 500A have a relatively high cohesive force and thus can serve to self-align the bond pads 120'/220 at one or more bonding layers to the bond pads 220/120' at one or more opposing bonding layers. In view of the above, applying the solder bumps 500A in the thermal compression operation (e.g., the gang bond operation) can effectively reduce the alignment accuracy requirement of the bonding apparatus and increase the alignment shift tolerance. For example, the alignment shift tolerance may be increased from about 10% of the pad size to about 30% of the pad size. In addition, the solder bumps 500A can serve to align a plurality of first semiconductor devices with a semiconductor wafer having a plurality of device regions corresponding to the plurality of the first semiconductor devices in a gang bond apparatus 900. Moreover, the dielectric material 300"/300' realizes the die-to-wafer bonding or even wafer-to-wafer bonding for semiconductor dies with bond pitch between a range of from about 10 µm to about 30 µm because the sealing or protecting material is pre-built on the bonding layer and subsequently expand to form a seamless filling structure upon heating (e.g., during a thermal compression bonding operation described herein) rather than formed by a separate underfill filling operation relying on the capillary force. Consequently, the production throughput or unit per hour (UPH) of the semiconductor packages can be increased. For example, the alignment shift tolerance may be increased from about 0.3 µm to about 1 µm for a pad size of about 3 µm, resulting in an increase of the UPH of the semiconductor packages from about 300 to about 7000.

In some embodiments, during the thermal compression operation, the bond pads 120' physically contact and bond to the bond pads 220, and then the dielectric material 300' physically contact and bond to the dielectric material 300".

In the cases where dies and a semiconductor wafer are bonded after chemical mechanical polishing (CMP) processes being performed on the dies and the semiconductor wafer, dishing may occur on Cu bond pads, and the roughness of the dielectric material contacting or surrounding the Cu bond pads has to achieve a surface roughness Ra<0.5 or else the Van der Waals force cannot be built during the first phase ($SiO_x$—$SiO_x$) of the hybrid bonding, which can result in dielectric material delamination. In contrast, according to some embodiments of the present disclosure, the bond pads 120' and 220 are protruding from the top surfaces of the dielectric materials 300' and 300", and thus the bond pads 120' can be bonded to the bond pads 220 by a thermal compression operation prior to bonding the dielectric material 300' to the dielectric material 300". Accordingly, the inter-diffusion between the conductive materials (e.g., metal atoms, such as Cu atoms) of the bond pads 120' and 220 can occur prior to the dielectric coalition, thus the aforesaid dielectric material delamination issue can be prevented, and the bonding of the semiconductor devices 10 and 20 can be relatively strong and stable. In addition, dielectric material delamination during the bonding of the bond pads 120' and 220 can be prevented as well.

In some embodiments, when the bond pads 120' physically contact the bond pads 220 in the thermal compression operation, inter-diffusion between the conductive materials (e.g., metal atoms, such as Cu atoms) of the bond pads 120' and 220 occurs due to the heat provided by the thermal compression operation. In some embodiments, the solder bumps 500A also start to melt and flow into the notches 500B when the bond pads 120' physically contact the bond pads 220. The notches 500B may serve as a buffer space for accommodating the material of the solder bumps 500A after bonding the bonding layers 100 and 200. Therefore, soldering bridge problem caused by the materials of the solder bumps 500A overflowing and contacting an adjacent soldering material or an adjacent pad can be effectively prevented. While the heat is continuously provided in the thermal compression operation, the dielectric materials 300' and 300" then start to expand and physically contact each other so as to bond the dielectric material 300' and the dielectric material 300". In some embodiments, since the CTE of the dielectric materials 300' and 300" is greater than the CTE of the bond pads 120' and 220, the dielectric materials 300' and 300" may expand and physically contact each other upon heating. In some embodiments, the polymeric monomers of the dielectric materials 300' and 300" crosslink and form polymeric resin materials upon contact, and thus the bonding strength between the dielectric material 300' and the dielectric material 300" is relatively strong. Accordingly, the as-formed dielectric material 300 provides a relatively strong bonding strength.

In some embodiments, the solder bumps 500A may deform and extend into the notches 500B so as to form an alignment mechanism 500, which is similar to the alignment mechanism 500 as illustrated in FIG. 1A.

In some embodiments, a plurality of semiconductor devices 20 may be flip chip bonded to the semiconductor device 10, and the thermal compression operation may be performed to bond the semiconductor devices 20 to the semiconductor device 10. In some embodiments, the aforesaid thermal compression operation includes performing a gang bond operation.

Figure 6A:
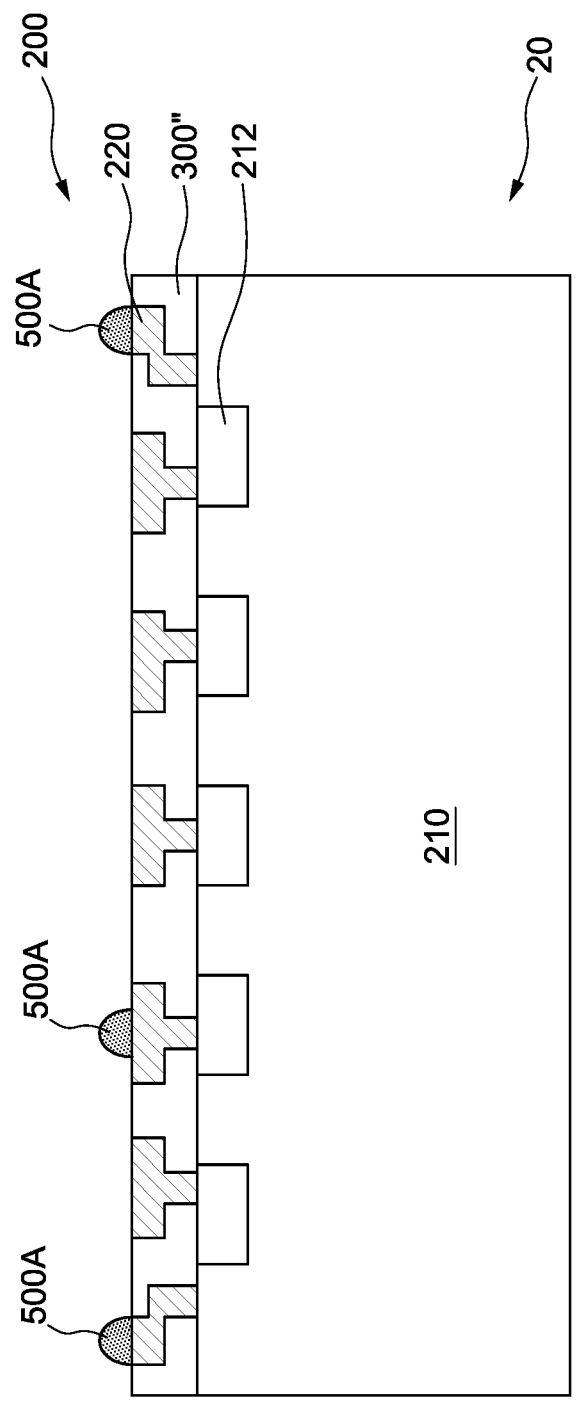
FIG. 6A, FIG. 6B and FIG. 6C illustrate various operations in a method of manufacturing a semiconductor package in accordance with some embodiments of the present disclosure.
Figure 6B:
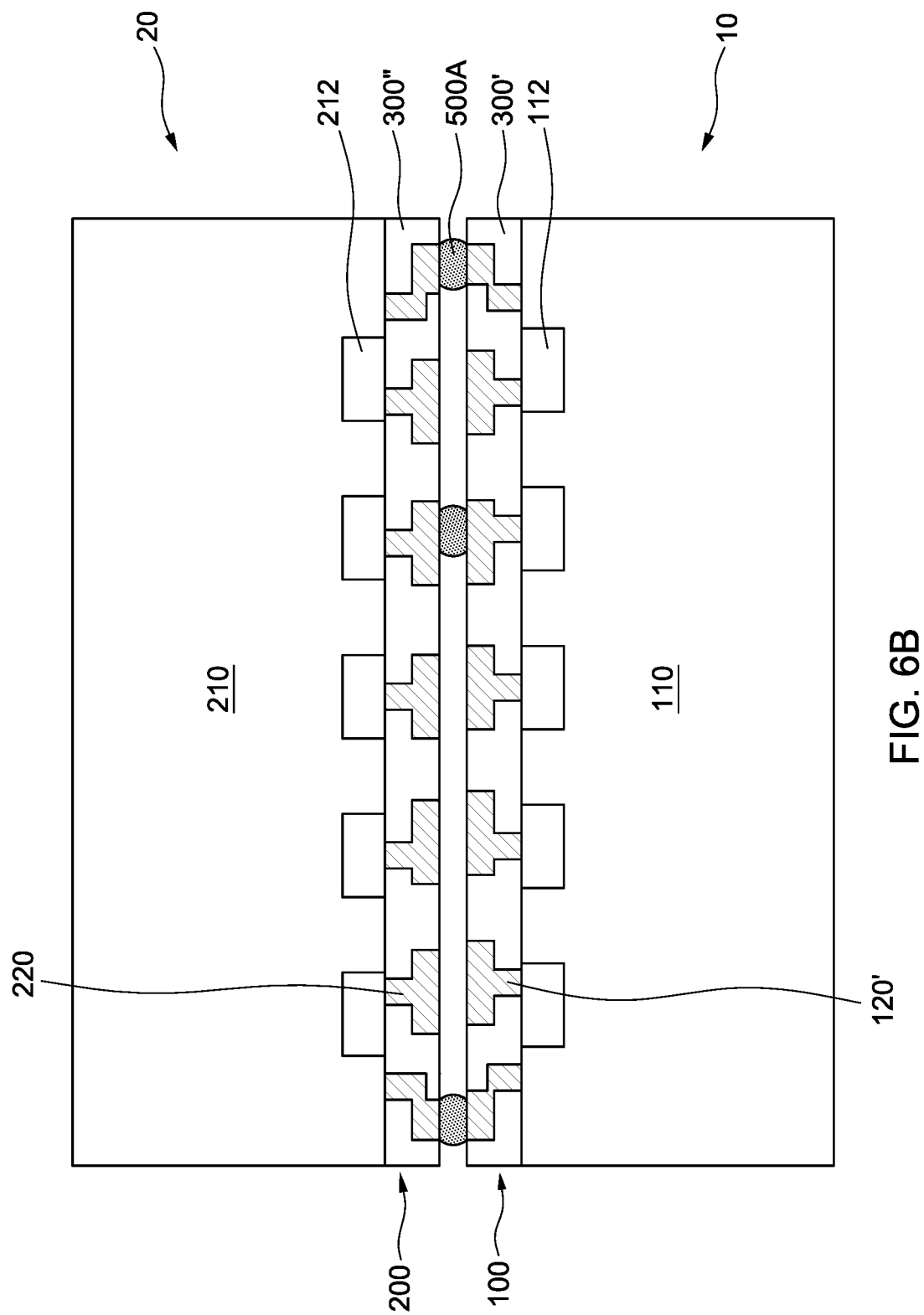
Figure 6C:
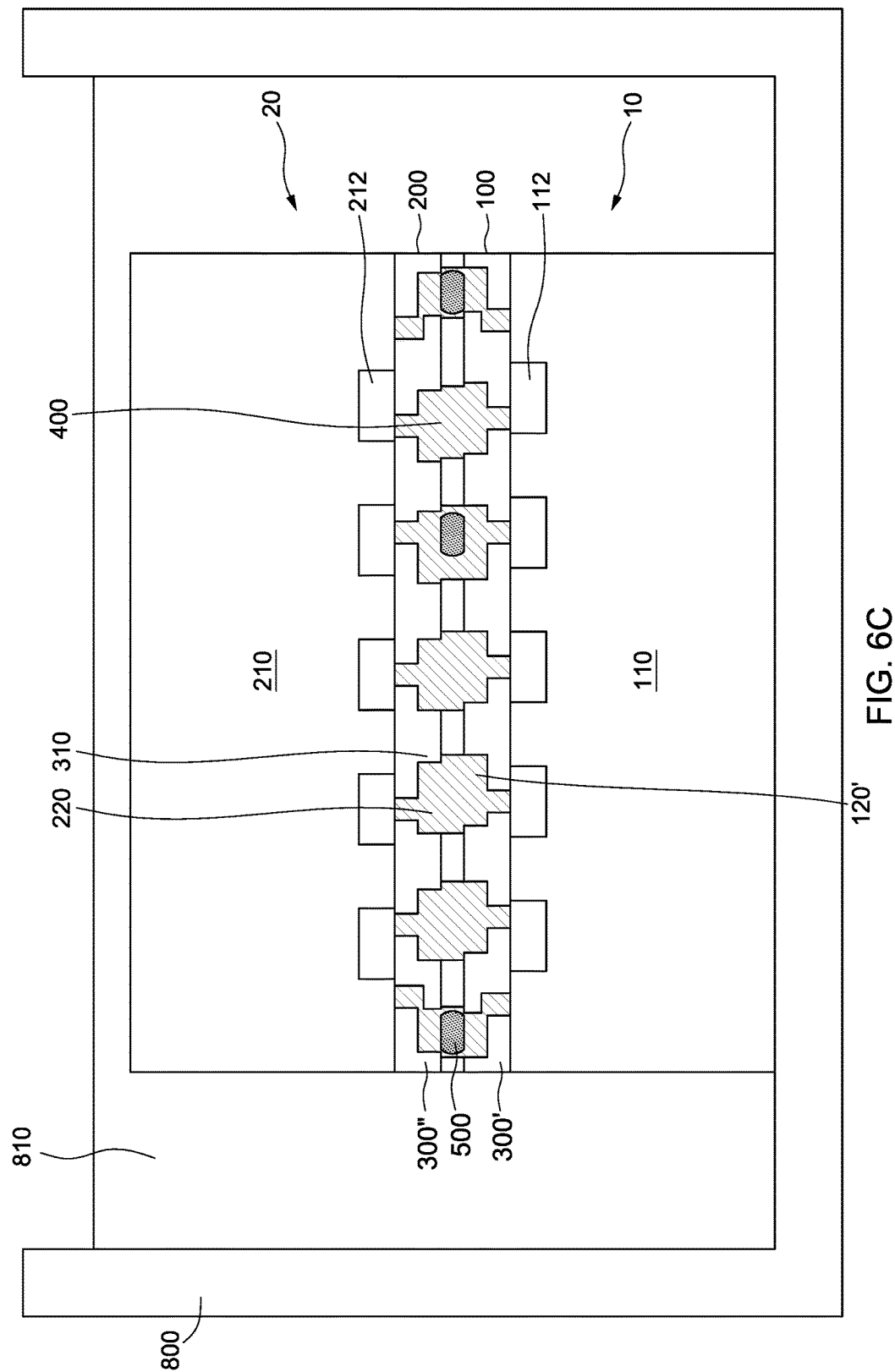

FIG. 6A, FIG. 6B and FIG. 6C illustrate various operations in a method of manufacturing a semiconductor package 3 in accordance with some embodiments of the present disclosure.

Referring to FIG. 6A, a semiconductor device 20 including a bonding layer 200 is provided, and solder bumps 500A are formed on the bond pads 220 of the semiconductor device 20. In some embodiments, upper surfaces of the bond pads 220 may be substantially coplanar with an upper surface of the dielectric material 300". In some other embodiments, the bond pad 220 may protrude from the upper surface of the dielectric material 300" (not shown in FIG. 6A).

Referring to FIG. 6B, a semiconductor device 10 including a bonding layer 100 is provided, and the bond pads 120' are face-to-face bonded to the bond pads 220 through the solder bumps 500A.

Referring to FIG. 6C, an electroless plating operation is performed to bond the semiconductor device 10 and the semiconductor device 20. In some embodiments, instead of performing a thermal compression operation, the structure illustrated in FIG. 6B is placed in a tank 800 filled with a plating solution 810. In some embodiments, a plated material 400 is formed between the bond pads 120' and the bond pads 220. In some embodiments, the plating solution 810 includes a gold (Au) compound, a silver (Ag) compound, an aluminum (Al) compound, a copper (Cu) compound, or a combination thereof.

Next, referring to FIG. 3A, the structure including the plated material 400 illustrated in FIG. 6C is removed from the plating solution 810, and a thermal operation is performed on the structure for the to expand and physically contact each other so as to bond the dielectric material 300' and the dielectric material 300". As such, the semiconductor package 3 illustrated in FIG. 3A is formed.

FIG. 7A, FIG. 7B, 7C and FIG. 7D illustrate various operations in a method of manufacturing a semiconductor package 4 in accordance with some embodiments of the present disclosure.

Figure 7A:
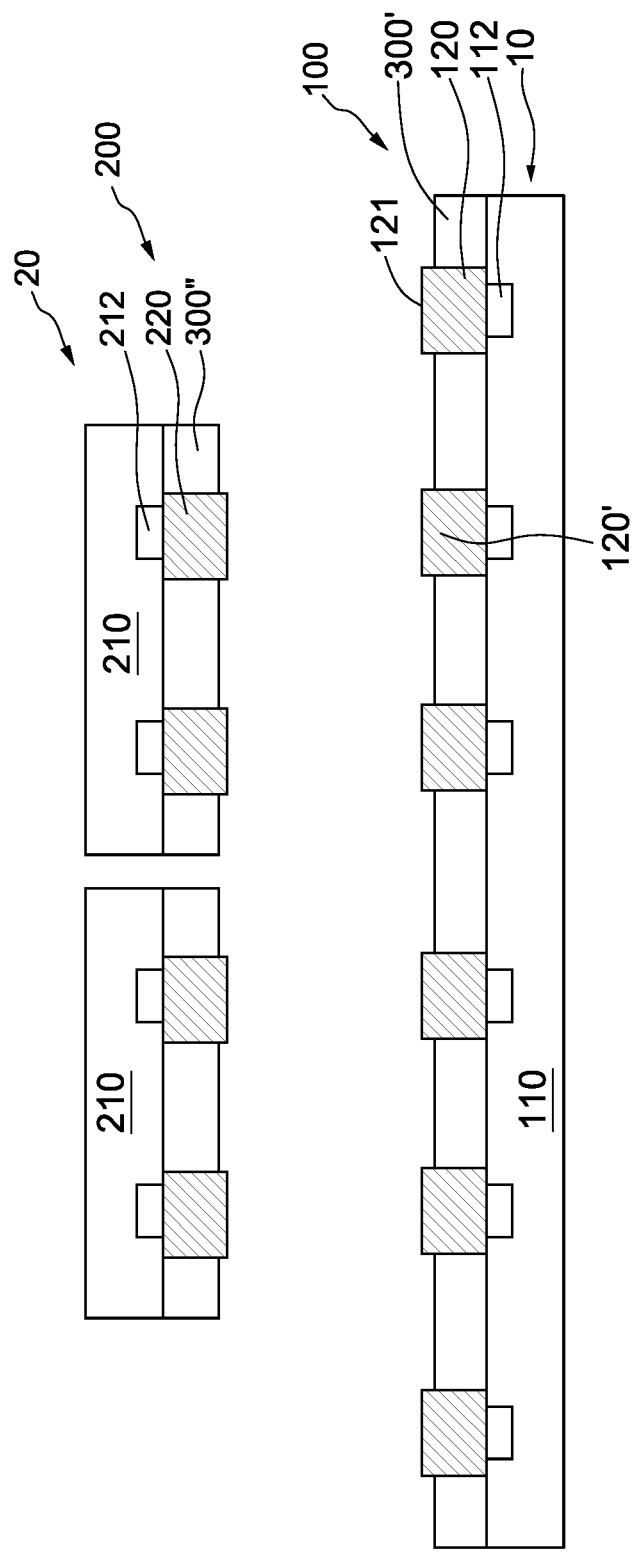
FIG. 7A, FIG. 7B, FIG. 7C and FIG. 7D illustrate various operations in a method of manufacturing a semiconductor package in accordance with some embodiments of the present disclosure.

Referring to FIG. 7A, operations similar to those illustrated in FIGS. 5A-5C are performed to form a semiconductor device 10 including a bonding layer 100 and a plurality of semiconductor devices 20 each including a bonding layer 200. In some embodiments, solder bumps 500A are not formed on the semiconductor device 10 and the semiconductor devices 20.

Figure 7B:
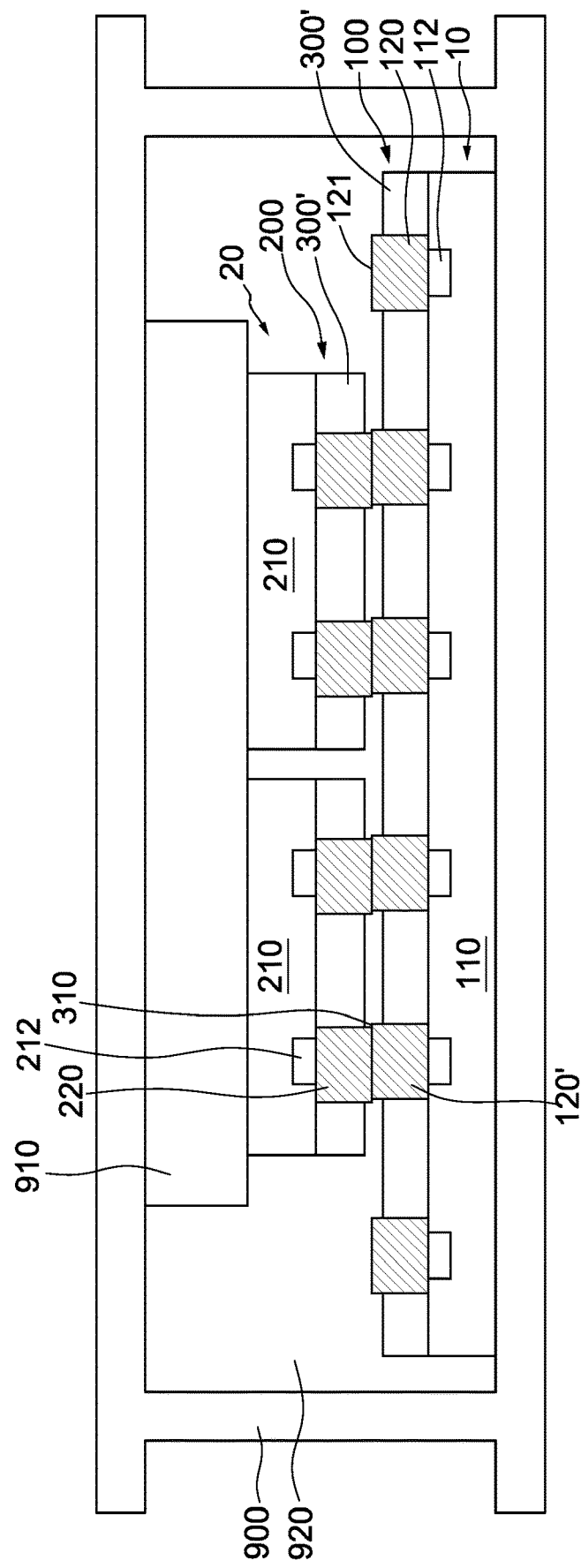

Referring to FIG. 7B, the semiconductor devices 20 bonded to the semiconductor device 10. In some embodiments, the bonding layers 220' are face-to-face bonded to the bonding layer 100. In some embodiments, a gang bond apparatus 900 including a gang bond head 910 and an enclosed chamber 920 is provided, and the structure as illustrated in FIG. 7B is placed in the chamber 920 of the gang bond apparatus 900. In some embodiments, the gang bond head 910 may serve as a pickup head to place the semiconductor devices 20 on the semiconductor device 10 and to align the semiconductor devices 20 with the semiconductor device 10.

Figure 7C:
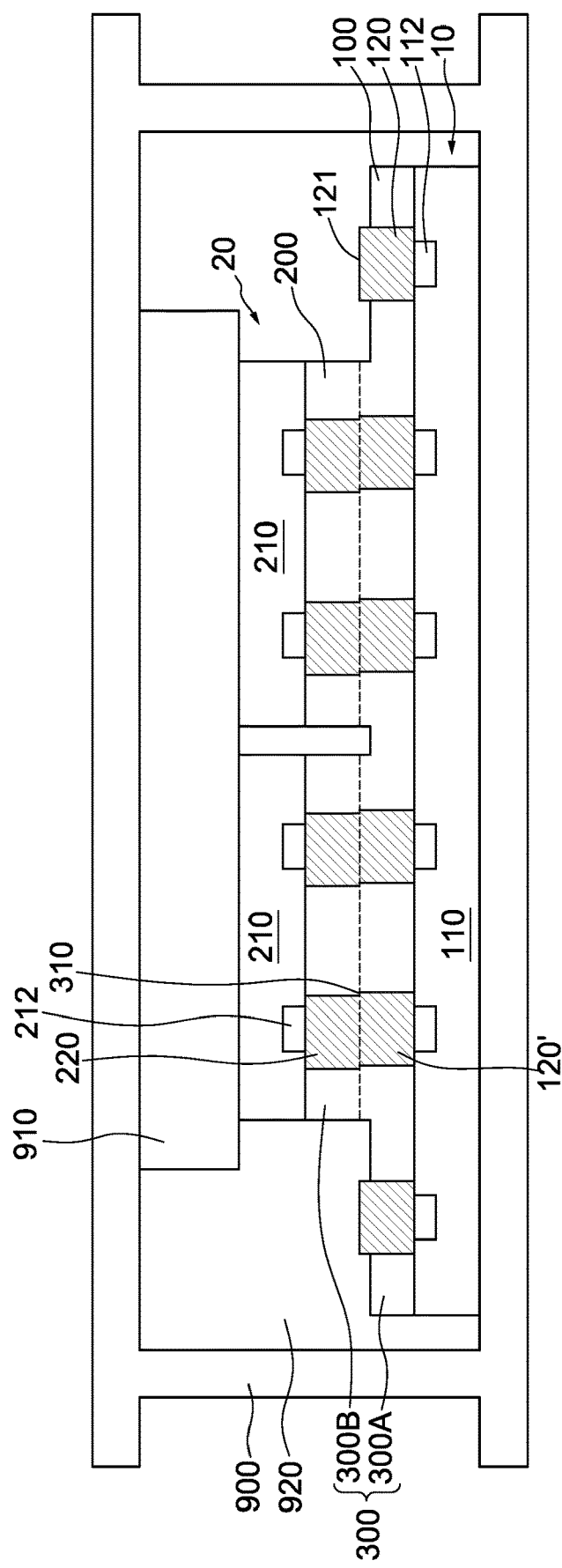

Referring to FIG. 7C, a thermal compression operation is performed to bond the semiconductor device 10 and the semiconductor device 20. In some embodiments, the bonding layers 220' are face-to-face bonded to the bonding layer 100 by performing a gang bond operation. In some embodiments, the thermal compression operation is similar to that illustrated in FIG. 5H.

Figure 7D:
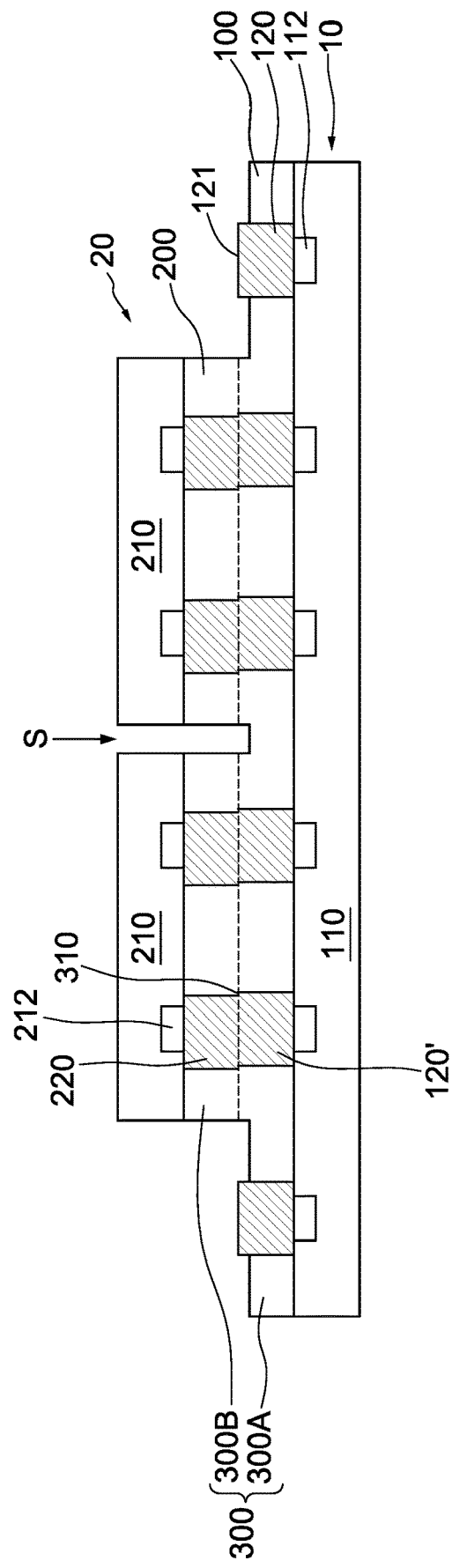

Referring to FIG. 7D, a singulation operation is performed on the substrate 110 and the dielectric material 300. As such, the semiconductor package 4 illustrated in FIG. 4A is formed.

FIG. 8A, FIG. 8B, FIG. 8C, FIG. 8D and FIG. 8E illustrate various operations in a method of manufacturing a semiconductor package 5 in accordance with some embodiments of the present disclosure.

Figure 8B:
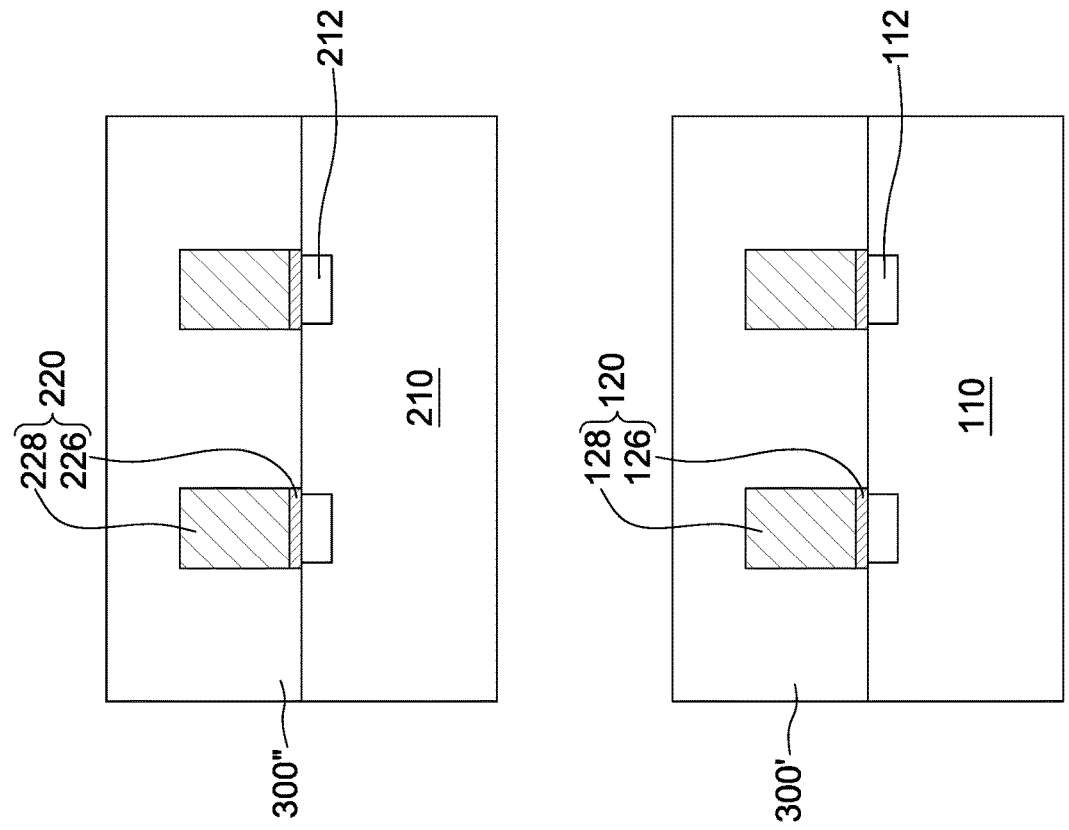
Figure 8A:
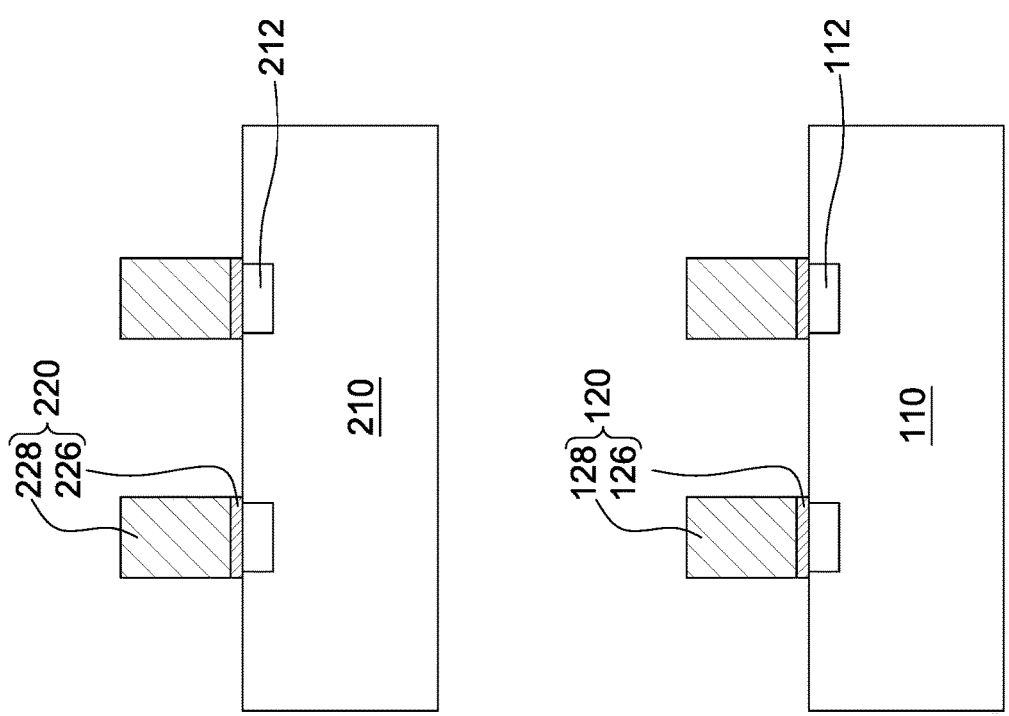

Referring to FIG. 8A, a substrate 110 including conductive pads 112 may be provided, bond pads 120 may be formed on the substrate 110, a substrate 210 including conductive pads 212 may be provided, and bond pads 220 may be formed on the substrate 210. In some embodiments, the bond pads 120 and 220 may include conductive pillars or conductive studs. In some embodiments, the bond pad 120 may include a seed layer 126 and a conductive layer 128 on the seed layer 126. In some embodiments, the bond pad 220 may include a seed layer 226 and a conductive layer 228 on the seed layer 226. In some embodiments, the bond pad 120 may be formed by the following operations: a seed layer 126 is formed on the substrate 110, a patterned photoresist layer having at least one opening exposing a portion of the seed layer 126 is formed over the substrate 110, a conductive layer 128 is formed on the seed layer 126 in the opening of the patterned photoresist layer to form the bond pad 120, and the patterned photoresist layer and portions of the seed layer 126 underneath the patterned photoresist layer are removed.

Referring to FIG. 8B, a dielectric material 300' may be formed on the substrate 110 and covering the bond pads 120, and a dielectric material 300" may be formed on the substrate 210 and covering the bond pads 220. In some embodiments, the materials of the dielectric materials 300' and 300" are similar to those described above, and the description thereof is omitted hereinafter. The dielectric materials 300' and 300" may be formed by coating.

Figure 8D:
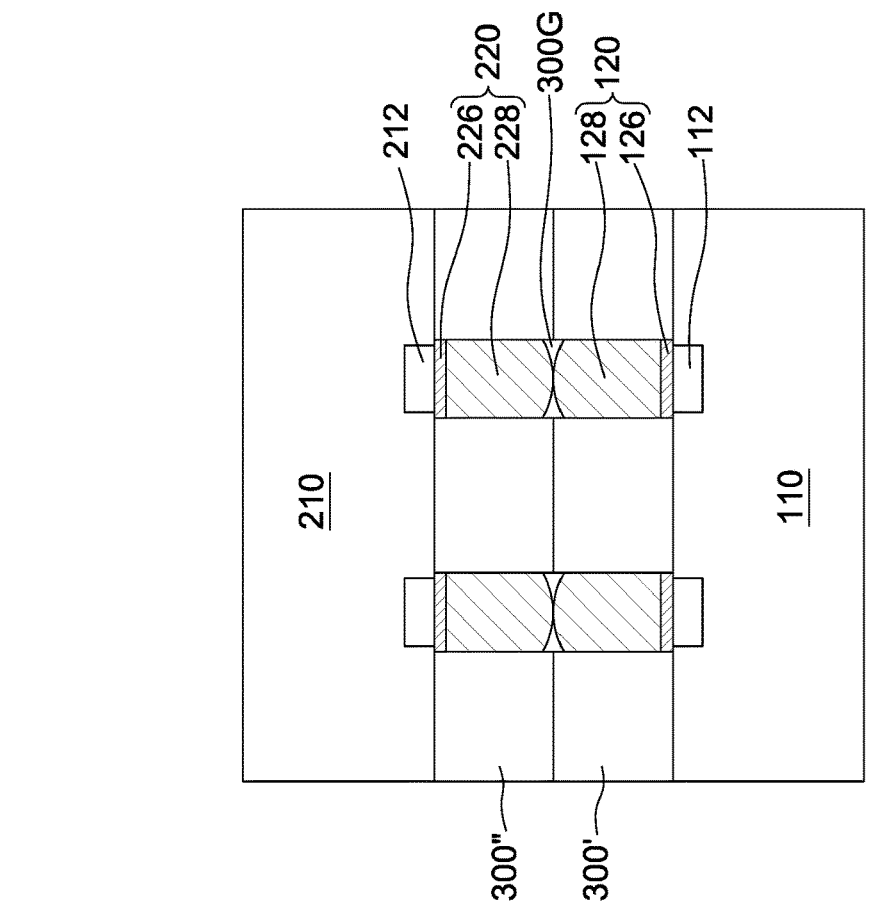
Figure 8C:
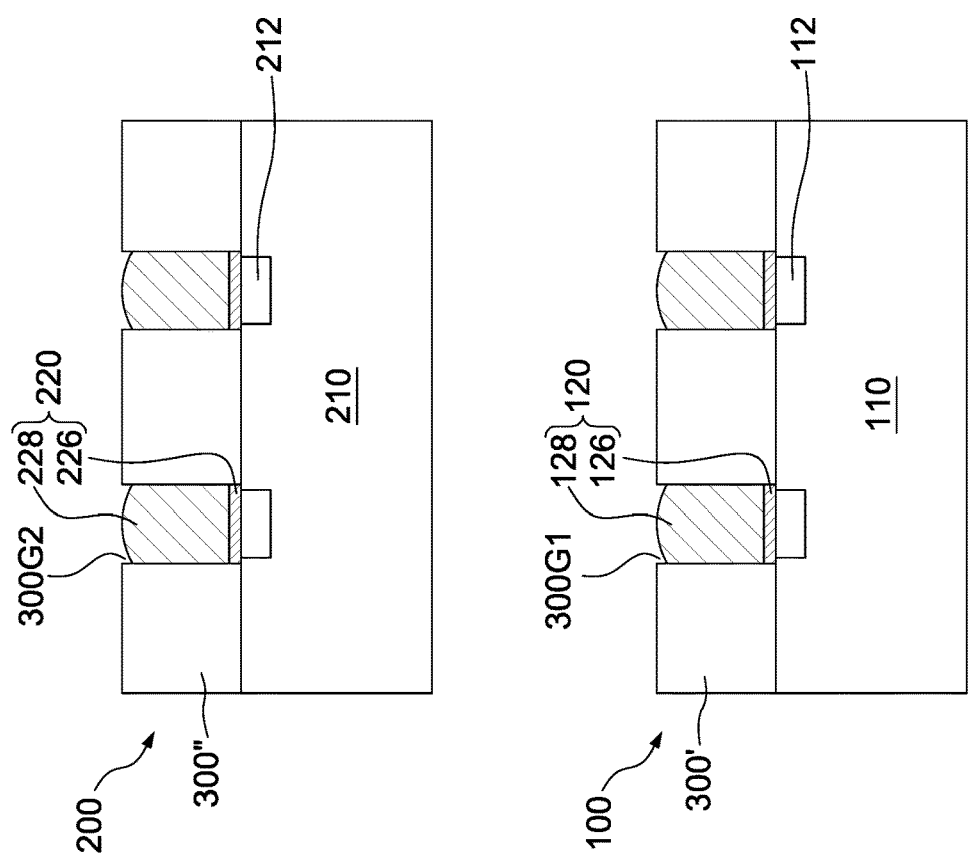

Referring to FIG. 8C, a planarization operation may be performed on the dielectric material 300' to expose upper surfaces of the bond pads 120, and a planarization operation may be performed on the dielectric material 300" to expose upper surfaces of the bond pads 220. In some embodiments, the bond pads 120 and the dielectric material 300' form a bonding layer 100, and the bond pads 220 and the dielectric material 300" form a bonding layer 200. In some embodiments, the planarization operation may include a chemical mechanical polishing (CMP) process. In some embodiments, gaps 300G1 may be formed between the conductive layer 128 and sidewalls of the dielectric material 300', and gaps 300G2 may be formed between the conductive layer 228 and sidewalls of the dielectric material 300". Portions of the conductive layer 128 exposed to the gaps 300G1 may be recessed toward the conductive layer 128. Portions of the conductive layer 228 exposed to the gaps 300G2 may be recessed toward the conductive layer 228. The gaps 300G1 and 300G2 and the recessed portions of the conductive layers 128 and 228 may be formed resulted from the corrosion occurred on the conductive layers 128 and 228 during the CMP processes. For example, the slurry used in the CMP process is prone to remove the conductive layers 128 or 228 in a way faster than to remove the dielectric material 300' or 300", especially the periphery portion of the conductive layers 128 or 228 shows significant corrosion compared to the center portion of the conductive layers 128 or 228.

Referring to FIG. 8D, the bonding layer 200 may be face-to-face bonded to the bonding layer 100. In some embodiments, the bond pads 220 may be face-to-face bonded to the bond pads 120. In some embodiments, gaps 300G formed of the gaps 300G1 and 300G2 remain between the conductive layers and the dielectric materials after the dielectric material 300' is bonded to the dielectric material 300".

Figure 8E:
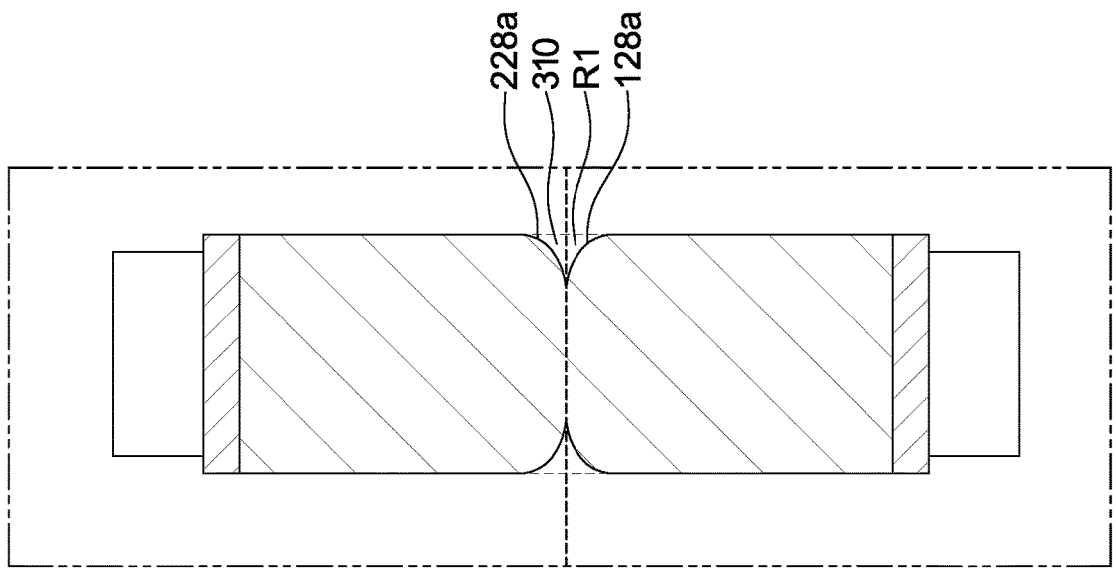
Figure 8E:
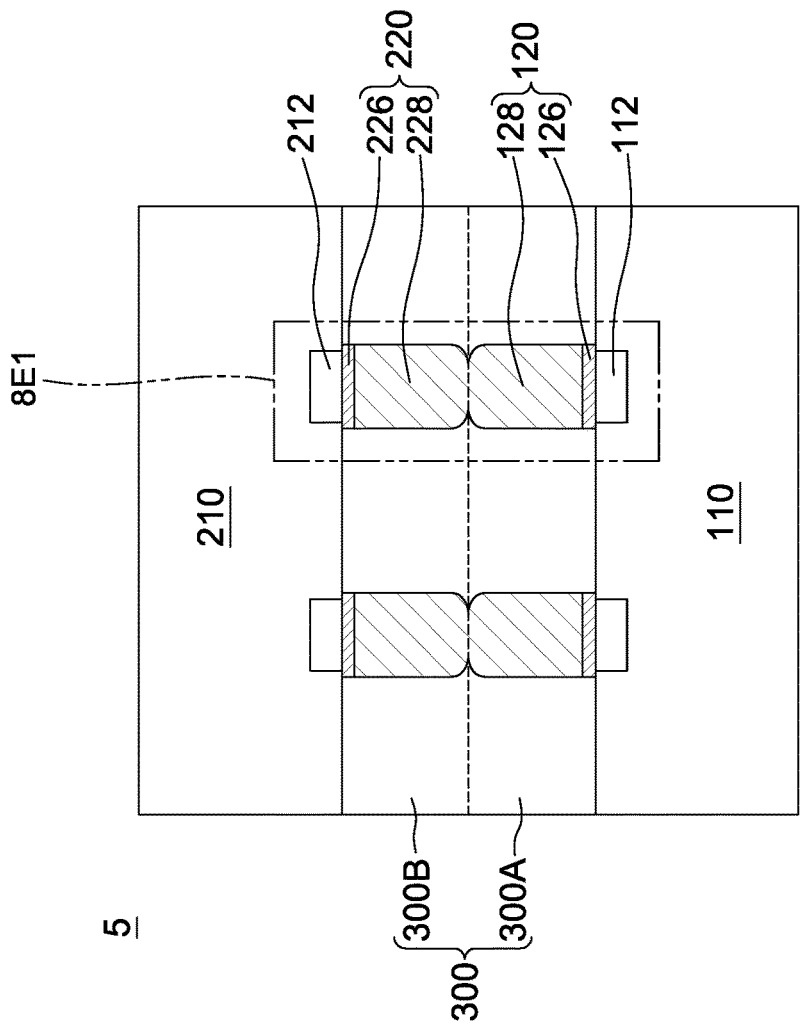

Referring to FIG. 8E, a thermal compression operation may be performed on the bonding layer 200 and the bonding layer 100. While the heat is continuously provided in the thermal compression operation, the dielectric materials 300' and 300" start to expand so as to bond the dielectric material 300' and the dielectric material 300". In some embodiments, the dielectric materials 300' and 300" may expand and fill in the gaps 300G upon heating to form the nearly seamless dielectric material 300. In some embodiments, since the CTE of the dielectric materials 300' and 300" is greater than the CTE of the bond pads 120 and 220, the dielectric materials 300' and 300" may fill in the gaps 300G and conform to the morphology of the bond pads 120 and 220 (e.g., the conductive layers 128 and 228) after the bonding operation As such, the semiconductor package 5 illustrated in FIG. 8E is formed.

FIG. 8E1 illustrates an enlarged bottom view of a portion of a semiconductor package 5 in accordance with some embodiments of the present disclosure. In some embodiments, FIG. 8E1 illustrates a cross-sectional view of the structure shown in the dashed box 8E1 in FIG. 8E. In some embodiments, the area 310 includes a recess R1 (e.g., including the gaps 300G1 and 300G2 illustrated in FIG. 8C) of the bond pad 120 and the bond pad 220, and the dielectric material 300 conforms to a morphology of the area 310. In some embodiments, the area 310 is defined by a surface 228a of the conductive layer 228 and a surface 128a of the conductive layer 228.

In some other embodiments, an alignment shift in bonding may occur between the bond pad 120 and the bond pad 220 (not shown in FIG. 8E1), and the area 310 which the dielectric material 300 conforms to may only include the recess (e.g., the gap 300G1) of the bond pad 120. For example, when a shift in bonding alignment occurs, the recess (e.g., the gap 300G2) of the bond pad 220 contacts the upper surface of the bond pad 120, and then the recess (e.g., the gap 300G2) of the bond pad 220 may be filled by the expansion of the materials of the bond pads 120 and 220 in the thermal compression operation. Therefore, in the present embodiments, the area 310 may include a recess of a bond pad that is not contacting the opposing bond pad as bonded. Similarly, in some other embodiments (not shown in FIG. 8E1), the area 310 which the dielectric material 300 conforms to may only include the recess (e.g., the gap 300G1) of the bond pad 220.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of said numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and the like. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor package, comprising:
   a first semiconductor device having a first bonding layer, wherein the first bonding layer comprises a first bond pad contacting an organic dielectric material;
   a second semiconductor device having a second bonding layer, wherein the second bonding layer comprises a second bond pad contacting the organic dielectric material; and
   an alignment material between the first bonding layer and the second bonding layer.

2. The semiconductor package of claim 1, wherein the alignment material surrounds a plurality of the first bond pads.

3. The semiconductor package of claim 1, wherein the organic dielectric material comprises a notch, and the alignment material is filled in the notch.

4. The semiconductor package of claim 1, wherein the alignment material comprises a soldering material.

5. A semiconductor package, comprising:
   a first semiconductor device having a first bonding layer, the first bonding layer comprising a first bond pad contacting a dielectric material;
   a second semiconductor device having a second bonding layer, the second bonding layer comprising a second bond pad contacting the dielectric material, the first semiconductor device being bonded to the second semiconductor device through the first bond pad, the second bond pad, and the dielectric material; and
   a first area defined by the first bond pad and the second bond pad,
   wherein the first area comprises a recess of the first bond pad, the second bond pad, or the combination thereof, and the dielectric material conforms to a morphology of the first area.

6. The semiconductor package of claim 5, wherein a coefficient of thermal expansion (CTE) of the dielectric material is greater than a CTE of the first bond pad or a CTE of the second bond pad.

7. The semiconductor package of claim 5, wherein the first bond pad and the second bond pad are surrounded by the dielectric material.

8. The semiconductor package of claim 5, wherein a pitch of the plurality of first bond pads is in a range of from about 10 μm to about 30 μm.

9. The semiconductor package of claim 5, further comprising an alignment material between the first bonding layer and the second bonding layer, wherein the alignment material surrounds a plurality of the first bond pads and a plurality of the second bond pads.

10. The semiconductor package of claim 9, wherein the alignment material comprises a soldering material.

11. The semiconductor package of claim 5, further comprising a plated material between the first bonding layer and the second bonding layer, the plated material contacting a sidewall of the first bond pad, a sidewall of the second bond pad, and the dielectric layer.

12. The semiconductor package of claim 5, wherein the first area is defined by a first surface and a second surface angled with the first surface, and an angle between the first surface and the second surface of the first area is equal to or less than about 90°.

13. A method for manufacturing a semiconductor package, comprising:
providing a first semiconductor device having a first bonding layer, the first bonding layer comprising a first bond pad contacting a dielectric material and protruding from a top surface of the dielectric material;
providing a second semiconductor device having a second bonding layer, the second bonding layer comprising a second bond pad;
aligning the first bond pad and the second bond pad, comprising self-aligning the first bond pad and the second bond pad through soldering between the first bonding layer and the second bonding layer; and
face-to-face bonding the first bond pad to the second bond pad by performing a thermal compression operation,
wherein aligning the first bond pad and the second bond pad is prior to bonding the first bond pad to the second bond pad,
wherein a plurality of solder bumps are formed on the first semiconductor device prior to the self-aligning.

14. The method of claim 13, wherein a notch is formed in the dielectric material prior to the self-aligning, the notch being nearby the solder bumps.

15. The method of claim 13, wherein
providing the first semiconductor device having the first bonding layer comprises providing a plurality of the first semiconductor devices having a plurality of the first bonding layers; and
performing the thermal compression operation comprises performing a gang bond operation to bond the plurality of the first bonding layers and the second bonding layer.

16. The method of claim 13, further comprising performing a chemical mechanical polishing process on the first bond pad and the dielectric material to form the first bond pad protruding from the top surface of the dielectric material.

* * * * *